(12) United States Patent
Gleason et al.

(10) Patent No.: US 9,163,307 B2
(45) Date of Patent: Oct. 20, 2015

(54) THREE-DIMENSIONAL PHOTORESISTS VIA FUNCTIONALIZATION OF POLYMER THIN FILMS FABRICATED BY ICVD

(71) Applicant: Massachusetts Institute of Technology, Cambridge, MA (US)

(72) Inventors: Karen K. Gleason, Cambridge, MA (US); Christy D. Petruczok, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 57 days.

(21) Appl. No.: 13/792,639

(22) Filed: Mar. 11, 2013

(65) Prior Publication Data

US 2013/0260054 A1 Oct. 3, 2013

Related U.S. Application Data

(60) Provisional application No. 61/616,139, filed on Mar. 27, 2012.

(51) Int. Cl.
| | |
|---|---|
| *C08J 7/06* | (2006.01) |
| *C23C 16/04* | (2006.01) |
| *G03F 7/025* | (2006.01) |
| *G03F 7/09* | (2006.01) |
| *G03F 7/20* | (2006.01) |
| *G03F 7/24* | (2006.01) |
| *C08J 7/18* | (2006.01) |
| *C08F 2/46* | (2006.01) |

(52) U.S. Cl.
CPC ............... *C23C 16/042* (2013.01); *G03F 7/025* (2013.01); *G03F 7/094* (2013.01); *G03F 7/2014* (2013.01); *G03F 7/24* (2013.01)

(58) Field of Classification Search
CPC .......... G03F 7/094; G03F 7/2014; G03F 7/24; C23C 16/042
USPC .................................. 427/487, 509
See application file for complete search history.

(56) References Cited

U.S. PATENT DOCUMENTS

| | | | |
|---|---|---|---|
| 6,040,116 A * | 3/2000 | Telser et al. ................... | 430/306 |
| 7,221,843 B2 | 5/2007 | Aalto | |
| 7,682,659 B1 | 3/2010 | Wang et al. | |
| 7,808,707 B2 | 10/2010 | Cano et al. | |
| 2002/0018912 A1* | 2/2002 | Jung et al. ..................... | 428/690 |
| 2006/0066006 A1* | 3/2006 | Haraldsson et al. .......... | 264/255 |
| 2012/0052214 A1* | 3/2012 | Tsai et al. ..................... | 427/558 |

OTHER PUBLICATIONS

Haller et al. Three-dimensional patterning of porous materials using vapor phase polymerization, Soft Matter, 2011, 7, pp. 2428-2432.*
Trujillo et al. Grafted functional polymer nanostructures patterned bottom-up by colloidal lithography and initiated chemical vapor deposition (iCVD), Chem. Mater. 2009, 21 pp. 742-750.*

(Continued)

*Primary Examiner* — Kelly M Gambetta
(74) *Attorney, Agent, or Firm* — Foley Hoag LLP

(57) ABSTRACT

Disclosed are simple, efficient, and scalable methods of patterning polymeric or metallic microstructures on planar or non-planar surfaces. The methods utilize initiated chemical vapor deposition (iCVD) technology. Also disclosed are patterned articles produced by these methods, and methods of using the articles.

16 Claims, 11 Drawing Sheets

(56) References Cited

OTHER PUBLICATIONS

O'Shaughnessy et al. Initiated chemical vapor deposition of a surface-modifiable copolymer for covalent attachment and patterning of nucleophilic ligands, Macromolecular Rapid Communications, 2007, 28, pp. 1877-1882.*

International Search Report dated May 16, 2013 from PCT/US13/30127 (our file MTV-130.25).

* cited by examiner

| Surface | Static Contact Angle |
|---|---|
| PPFDA | 111.5° ± 3.2° |
| P4VP-PTDA | 53.2° ± 2.4° |
| iCVD P4VP | 49.2° ± 1.2° |

(a)

(b)

THREE-DIMENSIONAL PHOTORESISTS VIA FUNCTIONALIZATION OF POLYMER THIN FILMS FABRICATED BY ICVD

RELATED APPLICATIONS

This application claims the benefit of priority to U.S. Provisional Patent Application Ser. No. 61/616,139, filed Mar. 27, 2012, the contents of which are hereby incorporated by reference.

GOVERNMENT SUPPORT

This invention was made with government support under Grant Nos. W911NF-07-D-0004 and W911NF-13-D-0001 awarded by the Army Research Office. The government has certain rights in this invention.

BACKGROUND OF THE INVENTION

Patterning processes for functional polymeric materials play an important role in the fabrication of microelectronic devices, including sensors and imaging displays, optical devices, such as diffraction gratings and photonic crystals, and tools for biological research and engineering. The ability to pattern such materials on non-planar substrates enables development of devices with unique or enhanced properties; for example, one could fabricate hemispherical or ellipsoidal cameras with reduced aberration and wider fields of view, and biomimetic pressure sensors incorporated into the curved surfaces of artificial skin. Established methods, such as conventional photolithography, are not readily applied to non-planar substrates. Consequently, great effort has been devoted to developing novel patterning techniques applicable to non-planar substrates. Detachment lithography, micromolding techniques, self-assembly, and surfactant-induced pattern formation have been used to pattern polymeric materials on curved substrates; however, these methods often suffer significant drawbacks, including long processing times, large numbers of steps, and low throughput. Moreover, many such techniques require a cleanroom environment, or, in the case of chemically-driven methods, can only be used to produce patterns of limited types.

There exists a need for a simple, fast, and scalable method for patterning polymers on non-planar surfaces.

SUMMARY OF THE INVENTION

In certain embodiments, the invention relates to a method of making a composition, comprising the steps of:
providing a substrate;
coating a surface of the substrate with a first polymer, thereby forming a coated surface of the substrate;
contacting the coated surface of the substrate with a photopolymerizable monomer, thereby forming a photopolymerizable surface of the substrate;
masking with a mask a portion of the photopolymerizable surface of the substrate, thereby forming an exposed portion of the photopolymerizable surface of the substrate and a masked portion of the photopolymerizable surface of the substrate;
exposing the exposed portion of the photopolymerizable surface of the substrate to radiation at a wavelength for a first period of time, thereby forming a coating material on the exposed portion of the surface of the substrate;
removing the mask, thereby exposing the masked portion of the photopolymerizable surface of the substrate; and
removing the masked portion of the photopolymerizable surface of the substrate, thereby forming the composition,
wherein the composition comprises the substrate and the coating material; and the coating material coats a portion of the surface of the substrate, thereby forming a feature comprising the coating material on the surface of the substrate.

In certain embodiments, the invention relates to a method of making a composition, comprising the steps of:
providing a substrate;
coating a surface of the substrate with a third polymer, thereby forming a third polymer-coated surface of the substrate;
coating the third polymer-coated surface of the substrate with a first polymer, thereby forming a first polymer-coated surface of the substrate;
contacting the first polymer-coated surface of the substrate with a photopolymerizable monomer, thereby forming a photopolymerizable surface of the substrate;
masking with a mask a portion of the photopolymerizable surface of the substrate, thereby forming an exposed portion of the photopolymerizable surface of the substrate and a masked portion of the photopolymerizable surface of the substrate;
exposing the exposed portion of the photopolymerizable surface of the substrate to radiation at a wavelength for a first period of time, thereby forming a coating material on the exposed portion of the surface of the substrate;
removing the mask, thereby exposing the masked portion of the photopolymerizable surface of the substrate; and
removing the masked portion of the photopolymerizable surface of the substrate, thereby forming the composition,
wherein the composition comprises the substrate, the third polymer, and the coating material; the third polymer coats the surface of the substrate; and the coating material coats a portion of the third polymer-coated surface of the substrate, thereby forming a feature comprising the coating material on the third polymer-coated surface of the substrate.

In certain embodiments, the invention relates to any one of the aforementioned methods, wherein the surface comprises a plurality of features.

In certain embodiments, the invention relates to any one of the aforementioned methods, wherein the substrate is non-planar.

In certain embodiments, the invention relates to any one of the aforementioned methods, wherein the surface of the substrate is concave or convex.

DETAILED DESCRIPTION OF THE INVENTION

Overview

Figure 1:
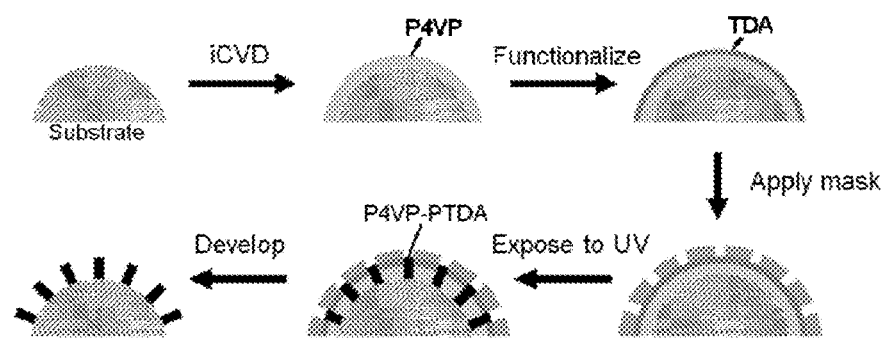
FIG. 1 depicts graphically a scheme showing a patterning process for creating polymer microstructures on curved substrates.

In certain embodiments, the invention relates to fabrication of polymer microstructures in the production of microelectronic, optical, and biomedical devices. In certain embodiments, polymeric features are deposited on non-planar (e.g., curved) substrates, thereby enabling fabrication of devices with unique or improved properties. In certain embodiments, the invention relates to a simple, scalable, and time- and energy-efficient patterning method using initiated chemical vapor deposition (iCVD). In certain embodiments, a thin film of poly(4-vinylpyridine) (P4VP) is deposited on non-planar substrates using iCVD. In certain embodiments, after deposition the photosensitivity of the film is enhanced by functionalizing the P4VP with 10,12-tricosadiynoic acid (TDA). In certain embodiments, the functionalized P4VP is irradiated at 254 nm, inducing photopolymerization of the TDA. In certain embodiments, unexposed regions are removed upon developing. TDA functionalization may be verified using FTIR, Raman, and UV-vis spectroscopy. In certain embodiments, the thickness of the film may be varied. In certain embodiments, features on the order of 1 μm may be obtained. In certain embodiments, the substrate is a glass rod with a diameter of about 2 mm to about 6 mm. In certain embodiments, bifunctional polymeric features or metal microstructures are deposited on glass rods. In certain embodiments, the invention relates to a method of depositing a functionalized iCVD film, wherein the sensitivity of the functionalized iCVD film is comparable to the sensitivities of commercial products. In certain embodiments, the processing time is on the order of 1 h. In certain embodiments, multiple substrates can be prepared simultaneously.

Initiated Chemical Vapor Deposition

Materials-processing often involves the deposition of films or layers on a surface of a substrate. One manner of effecting the deposition of such films or layers is chemical vapor deposition (CVD). CVD involves a chemical reaction of vapor phase chemicals or reactants that contain the constituents to be deposited on the substrate. Reactant gases are introduced into a reaction chamber or reactor, are decomposed, and are reacted at a chilled surface to form the desired film or layer.

One method of CVD is initiated CVD (iCVD). In an iCVD process, thin filament wires are heated, thus supplying the energy to fragment a thermally-labile initiator, thereby forming a radical at moderate temperatures. The use of an initiator not only allows the chemistry to be controlled, but also accelerates film growth and provides control of molecular weight and rate. The energy input is low due to low filament temperatures, but high growth rates may be achieved. The process progresses independent of the shape or composition of the substrate, is easily scalable, and easily integrated with other processes.

In certain embodiments, iCVD takes place in a reactor. In certain embodiments, a variety of monomer species may be polymerized and deposited by iCVD; these monomer species are well-known in the art. In certain embodiments, the surface to be coated is placed on a stage in the reactor and gaseous precursor molecules are fed into the reactor. The stage may be the bottom of the reactor (i.e., not a separate entity). In certain embodiments, a variety of carrier gases are useful in iCVD; these carrier gases are well-known in the art.

In certain embodiments, the iCVD reactor has automated electronics to control reactor pressure and to control reactant flow rates. In certain embodiments, any unreacted vapors may be exhausted from the system.

In certain embodiments, the iCVD coating process can take place at a range of pressures from atmospheric pressure to low vacuum. In certain embodiments, the pressure is less than about 50 torr. In certain embodiments, the pressure is less than about 40 torr. In certain embodiments, the pressure is less than about 30 torr. In certain embodiments, the pressure is less than about 20 torr. In certain embodiments, the pressure is less than about 10 torr. In certain embodiments, the pressure is less than about 5 torr. In certain embodiments, the pressure is less than about 1 torr. In certain embodiments, the pressure is less than about 0.7 torr. In certain embodiments, the pressure is less than about 0.4 torr. In certain embodiments, the pressure is about 50 torr. In certain embodiments, the pressure is about 40 torr. In certain embodiments, the pressure is about 30 torr. In certain embodiments, the pressure is about 20 torr. In certain embodiments, the pressure is about 10 torr. In certain embodiments, the pressure is about 5 torr. In certain embodiments, the pressure is about 1 torr. In certain embodiments, the pressure is about 0.7 torr. In certain embodiments, the pressure is about 0.4 torr. In certain embodiments the pressure is about 1 torr; about 0.9 torr; about 0.8 torr; about 0.7 torr; about 0.6 torr; about 0.5 torr; about 0.4 torr; about 0.3 torr; about 0.2 torr; or about 0.1 torr. In certain embodiments, the pressure is greater than about 1 m torr.

In certain embodiments, the flow rate of the monomer can be adjusted in the iCVD method. In certain embodiments, the monomer flow rate is about 100 sccm (standard cubic centimeters per minute). In certain embodiments, the monomer flow rate is about 90 sccm. In certain embodiments, the monomer flow rate is about 80 sccm. In certain embodiments the monomer flow rate is about 70 sccm. In certain embodiments, the monomer flow rate is about 60 sccm. In certain embodiments, the monomer flow rate is about 50 sccm. In certain embodiments, the monomer flow rate is about 40 sccm. In certain embodiments, the monomer flow rate is about 30 sccm. In certain embodiments, the monomer flow rate is about 20 sccm. In certain embodiments, the monomer flow rate is less than about 100 sccm. In certain embodiments, the monomer flow rate is less than about 90 sccm. In certain embodiments, the monomer flow rate is less than about 80 sccm. In certain embodiments, the monomer flow rate is less than about 70 sccm. In certain embodiments, the monomer flow rate is less than about 60 sccm. In certain embodiments, the monomer flow rate is less than about 50 sccm. In certain embodiments, the monomer flow rate is less than about 40 sccm. In certain embodiments, the monomer flow rate is less than about 30 sccm. In certain embodiments, the monomer flow rate is less than about 20 sccm. In certain embodiments, the monomer flow rate is about 15 sccm. In certain embodiments, the flow rate is less than about 15 sccm. In certain embodiments, the monomer flow rate is about 14 sccm. In certain embodiments, the flow rate is less than about 14 sccm. In certain embodiments, the monomer flow rate is about 13 sccm. In certain embodiments, the flow rate is less than about 13 sccm. In certain embodiments, the monomer flow rate is about 12 sccm. In certain embodiments, the flow rate is less than about 12 sccm. In certain embodiments, the monomer flow rate is about 11 sccm. In certain embodiments, the flow rate is less than about 11 sccm. In certain embodiments, the monomer flow rate is about 10 sccm. In certain embodiments, the flow rate is less than about 10 sccm. In certain embodiments, the monomer flow rate is about 9 sccm. In certain embodiments, the flow rate is less than about 9 sccm. In certain embodiments, the monomer flow rate is about 8 sccm. In certain embodiments, the flow rate is less than about 8 sccm. In certain embodiments, the monomer flow rate is about 7 sccm. In certain embodiments, the flow rate is less than about 7 sccm. In certain embodiments, the monomer flow rate is about 6 sccm. In certain embodiments, the flow rate is less than about 6 sccm. In certain embodiments, the monomer flow rate is about 5 sccm. In certain embodiments, the flow rate is less than about 5 sccm. In certain embodiments, the monomer flow rate is about 3 sccm. In certain embodiments, the flow rate is less than about 3 sccm. In certain embodiments, the monomer flow rate is about 1.5 sccm. In certain embodiments, the flow rate is less than about 1.5 sccm. In certain embodiments, the monomer flow rate is about 0.75 sccm. In certain embodiments, the flow rate is less than about 0.75 sccm. In certain embodiments, the flow rate is greater than about 0.5 sccm. When more than one monomer is used (i.e., to deposit co-polymers), the flow rate of the additional monomers, in certain embodiments, may be any of those presented above for the monomer.

In certain embodiments, the temperature of the monomer can be adjusted in the iCVD method. In certain embodiments, the monomer can be heated and delivered to the chamber by a heated mass flow controller. In certain embodiments, the monomer is heated at about 30° C., about 35° C., about 40° C., about 45° C., about 50° C., about 55° C., about 60° C., about 65° C., about 70° C., about 75° C., about 80° C., about 90° C., about 100° C., about 110° C., about 120° C., or about 130° C.

In certain embodiments, the flow rate of the initiator can be adjusted in the iCVD method. In certain embodiments the initiator flow rate is about 100 sccm. In certain embodiments, the initiator flow rate is about 90 sccm. In certain embodiments, the initiator flow rate is about 80 sccm. In certain embodiments, the initiator flow rate is about 70 sccm. In certain embodiments, the initiator flow rate is about 60 sccm. In certain embodiments, the initiator flow rate is about 50 sccm. In certain embodiments, the initiator flow rate is about 40 sccm. In certain embodiments, the initiator flow rate is about 30 sccm. In certain embodiments, the initiator flow rate is about 20 sccm. In certain embodiments, the initiator flow rate is less than about 100 sccm. In certain embodiments, the initiator flow rate is less than about 90 sccm. In certain embodiments, the initiator flow rate is less than about 80 sccm. In certain embodiments, the initiator flow rate is less than about 70 sccm. In certain embodiments, the initiator flow rate is less than about 60 sccm. In certain embodiments, the initiator flow rate is less than about 50 sccm. In certain embodiments, the initiator flow rate is less than about 40 sccm. In certain embodiments, the initiator flow rate is less than about 30 sccm. In certain embodiments, the initiator flow rate is less than about 20 sccm. In certain embodiments, the initiator flow rate is about 10 sccm. In certain embodiments, the flow rate is less than about 10 sccm. In certain embodiments, the initiator flow rate is about 5 sccm. In certain embodiments, the flow rate is less than about 5 sccm. In certain embodiments, the initiator flow rate is about 3 sccm. In certain embodiments, the flow rate is less than about 3 sccm. In certain embodiments, the initiator flow rate is about 1.5 sccm. In certain embodiments, the flow rate is less than about 1.5 sccm. In certain embodiments, the initiator flow rate is about 0.75 sccm. In certain embodiments, the flow rate is less than about 0.75 sccm. In certain embodiments, the flow rate is greater than about 0.5 sccm. In certain embodiments, a variety of initiators are useful in iCVD; these initiators are well-known in the art.

In certain embodiments, the carrier gas is an inert gas. In certain embodiments, the carrier gas is nitrogen or argon.

In certain embodiments, the flow rate of the carrier gas can be adjusted in the iCVD method. In certain embodiments, the carrier gas flow rate is about 1000 sccm. In certain embodiments, the carrier gas flow rate is about 900 sccm. In certain embodiments, the carrier gas flow rate is about 800 sccm. In certain embodiments, the carrier gas flow rate is about 700 sccm. In certain embodiments, the carrier gas flow rate is about 600 sccm. In certain embodiments, the carrier gas flow rate is about 500 sccm. In certain embodiments, the carrier gas flow rate is about 400 sccm. In certain embodiments, the carrier gas flow rate is about 300 sccm. In certain embodiments, the carrier gas flow rate is about 200 sccm. In certain embodiments, the carrier gas flow rate is about 100 sccm. In certain embodiments, the carrier gas flow rate is about 90 sccm. In certain embodiments, the carrier gas flow rate is about 80 sccm. In certain embodiments, the carrier gas flow rate is about 70 sccm. In certain embodiments, the carrier gas flow rate is about 60 sccm. In certain embodiments, the carrier gas flow rate is about 50 sccm. In certain embodiments, the carrier gas flow rate is about 40 sccm. In certain embodiments, the carrier gas flow rate is about 30 sccm. In certain embodiments, the carrier gas flow rate is about 20 sccm. In certain embodiments, the carrier gas flow rate is less than about 1000 sccm. In certain embodiments, the carrier gas flow rate is less than about 900 sccm. In certain embodiments, the carrier gas flow rate is less than about 800 sccm. In certain embodiments, the carrier gas flow rate is less than about 700 sccm. In certain embodiments, the carrier gas flow rate is less than about 600 sccm. In certain embodiments, the carrier gas flow rate is less than about 500 sccm. In certain embodiments, the carrier gas flow rate is less than about 400 sccm. In certain embodiments, the carrier gas flow rate is less than about 300 sccm. In certain embodiments, the carrier gas flow rate is less than about 200 sccm. In certain embodiments, the carrier gas flow rate is less than about 100 sccm. In certain embodiments, the carrier gas flow rate is less than about 90 sccm. In certain embodiments, the carrier gas flow rate is less than about 80 sccm. In certain embodiments, the carrier gas flow rate is less than about 70 sccm. In certain embodiments, the carrier gas flow rate is less than about 60 sccm. In certain embodiments the carrier gas flow rate is less than about 50 sccm. In certain, embodiments the carrier gas flow rate is less than about 40 sccm. In certain embodiments, the carrier gas flow rate is less than about 30 sccm. In certain embodiments, the carrier gas flow rate is less than about 20 sccm. In certain embodiments, the carrier gas flow rate is about 10 sccm. In certain embodiments, the flow rate is less than about 10 sccm. In certain embodiments, the carrier gas flow rate is about 5 sccm. In certain embodiments, the flow rate is less than about 5 sccm. In certain embodiments, the flow rate is greater than about 4 sccm.

In certain embodiments, the temperature of the filament can be adjusted in the iCVD method. In certain embodiments the temperature of the filament is about 350° C. In certain embodiments the temperature of the filament is about 300° C. In certain embodiments the temperature of the filament is about 250° C. In certain embodiments the temperature of the filament is about 245° C. In certain embodiments the temperature of the filament is about 235° C. In certain embodiments the temperature of the filament is about 225° C. In certain embodiments the temperature of the filament is about 200° C. In certain embodiments the temperature of the filament is about 150° C. In certain embodiments the temperature of the filament is about 100° C.

In certain embodiments, the filament is about 0.1 cm to about 20 cm from the substrate stage. In certain embodiments, the filament is about 0.1 cm, about 0.2 cm, about 0.3 cm, about 0.4 cm, about 0.5 cm, about 0.6 cm, about 0.7 cm, about 0.8 cm, about 0.9 cm, about 1.0 cm, about 1.1 cm, about 1.2 cm, about 1.3 cm, about 1.4 cm, about 1.5 cm, about 1.6 cm, about 1.7 cm, about 1.8 cm, about 1.9 cm, about 2.0 cm, about 2.1 cm, about 2.2 cm, about 2.3 cm, about 2.4 cm, about 2.5 cm, about 3.0 cm, about 3.5 cm, about 4.0 cm, about 4.5 cm, about 5.0 cm, about 5.5 cm, about 6.0 cm, about 6.5 cm, about 7.0 cm, about 7.5 cm, about 8.0 cm, about 8.5 cm, about 9.0 cm, about 9.5 cm, about 10 cm, about 11 cm, about 12 cm, about 13 cm, about 14 cm, about 15 cm, about 16 cm, about 17 cm, about 18 cm, about 19 cm, or about 20 cm from the substrate stage. In certain embodiments, the filament is about 1.4 cm from the substrate stage.

In certain embodiments, the filament is oriented in any orientation with respect to the substrate stage or the chamber. In certain embodiments, the filament is oriented above the substrate stage, below the substrate stage, or beside the substrate stage.

In certain embodiments, the iCVD coating process can take place at a range of temperatures of the substrate stage. In certain embodiments, the temperature of the substrate stage is ambient temperature. In certain embodiments, the temperature of the substrate stage is about 25° C.; in yet other embodiments the temperature of the substrate stage is between about 25° C. and about 100° C., or between about 0° C. and about 25° C. In certain embodiments said temperature of the substrate stage is controlled by water.

In certain embodiments, the rate of polymer deposition is about 1 micron/minute. In certain embodiments, the rate of polymer deposition is between about 1 micron/minute and about 50 nm/minute. In certain embodiments, the rate of polymer deposition is between about 10 micron/minute and about 50 nm/minute. In certain embodiments, the rate of polymer deposition is between about 100 micron/minute and about 50 nm/minute. In certain embodiments, the rate of polymer deposition is between about 1 nm/minute and about 50 nm/minute. In certain embodiments, the rate of polymer deposition is between about 10 nm/minute and about 50 nm/minute. In certain embodiments, the rate of polymer deposition is between about 10 nm/minute and about 25 nm/minute.

Importantly, in certain embodiments, the iCVD process can be used to deposit a photoresist. For example, iCVD is used to deposit a polymer on a planar or non-planar surface. Then, the polymer is functionalized with a species that enhances photoreactivity. Finally, as with conventional lithography, a mask is applied, the functionalized and masked substrate is exposed to UV radiation, and the patterned substrate is developed. In certain embodiments, the process takes less than about 1.5 h. In certain embodiments, the process need not take place in a clean room. In certain embodiments, the process requires only one more step than conventional lithography. In certain embodiments, substrates are pre-coated with an iCVD polymer and stored. In certain embodiments, the process results in patterned features from about 1 μm to about 1 mm in size.

As an example, films of poly(4-vinylpyridine) (P4VP) can be deposited onto a substrate surface by iCVD. After the iCVD step, the P4VP film may be post-functionalized with a photoreactive moiety, such as 10,12-tricosadiynoic acid (TDA). Submerging the P4VP-coated substrate in a TDA solution promotes hydrogen bonding between the acid moieties of the diacetylene and nitrogen atoms in the P4VP pyridine rings. TDA functionalization is uniform over the surface of the curved substrates due to the conformality of the iCVD process and non-directionality of the functionalization step. A flexible mask is applied, and the functionalized surface is exposed at 254 nm to photopolymerize the diacetylene species. The exposed film is developed in ethanol, which easily solvates the P4VP coated with TDA while leaving behind P4VP coated with polydiacetylene (PTDA).

Compositions of the Invention

In certain embodiments, the invention relates to a composition, wherein the composition comprises a substrate and a coating material; and the coating material coats a portion of a surface of the substrate, thereby forming a feature comprising the coating material on the surface of the substrate.

In certain embodiments, the invention relates to any one of the aforementioned compositions, wherein the surface comprises a plurality of features.

In certain embodiments, the invention relates to any one of the aforementioned compositions, wherein the features are periodic or repetitive.

In certain embodiments, the invention relates to any one of the aforementioned compositions, wherein the size of one dimension of the features is about 0.5 μm to about 1 mm. In certain embodiments, the invention relates to any one of the aforementioned compositions, wherein the size of one dimension of the features is about 0.5 μm, about 1.0 μm, about 1.5 μm, about 2.0 μm, about 2.5 μm, about 3.0 μm, about 3.5 μm, about 4.0 μm, about 4.5 μm, about 5.0 μm, about 10 μm, about 15 μm, about 20 μm, about 25 μm, about 30 μm, about 35 µm, about 40 µm, about 45 µm, about 50 µm, about 60 µm, about 70 µm, about 80 µm, about 90 µm, about 100 µm, about 150 µm, about 200 µm, about 250 µm, about 300 µm, about 350 µm, about 400 µm, about 450 µm, about 500 µm, about 550 µm, about 600 µm, about 650 µm, about 700 µm, about 750 µm, about 800 µm, about 850 µm, about 900 µm, about 950 µm, or about 1 mm. In certain embodiments, the dimension of the features is length of one side or diameter. In certain embodiments, the dimension of the features is the smaller dimension.

In certain embodiments, the invention relates to any one of the aforementioned compositions, wherein the features are of a substantially uniform thickness or height.

In certain embodiments, the invention relates to any one of the aforementioned compositions, wherein the thickness of the features does not vary more than 10% over the surface.

In certain embodiments, the invention relates to any one of the aforementioned compositions, wherein the thickness of the features does not vary more than 5% over the surface.

In certain embodiments, the invention relates to any one of the aforementioned compositions, wherein the thickness of the features is about 5 nm to about 1500 nm. In certain embodiments, the invention relates to any one of the aforementioned compositions, wherein the thickness of the features is about 5 nm, about 6 nm, about 7 nm, about 8 nm, about 9 nm, about 10 nm, about 20 nm, about 30 nm, about 40 nm, about 50 nm, about 60 nm, about 70 nm, about 80 nm, about 90 nm, about 100 nm, about 125 nm, about 150 nm, about 175 nm, about 200 nm, about 225 nm, about 250 nm, about 275 nm, about 300 nm, about 325 nm, about 350 nm, about 375 nm, about 400 nm, about 425 nm, about 450 nm, about 475 nm, about 500 nm, about 525 nm, about 550 nm, about 575 nm, about 600 nm, about 625 nm, about 650 nm, about 675 nm, about 700 nm, about 725 nm, about 750 nm, about 775 nm, about 800 nm, about, 825 nm, about 850 nm, about 875 nm, about 900 nm, about 1000 nm, about 1100 nm, about 1200 nm, about 1300 nm, about 1400 nm, or about 1500 nm.

In certain embodiments, the invention relates to any one of the aforementioned compositions, wherein the distance between features is about 500 nm to about 10 mm.

In certain embodiments, the invention relates to any one of the aforementioned compositions, wherein the coating material comprises a first polymer and a second polymer.

In certain embodiments, the invention relates to any one of the aforementioned compositions, wherein the first polymer comprises poly(4-vinylpyridine), poly(divinylbenzene), poly(maleic anhydride), poly(styrene), poly(tert-butyl acrylate), poly(trivinyltrimethoxycyclotrisiloxane), poly(furfuryl methacrylate), poly(glycidyl methacrylate), poly(4-aminostyrene), poly(hydroxyethyl methacrylate), poly(N-isopropylacrylamide), poly(1H,1H,2H,2H-perfluorodecyl acrylate), Poly(methyl methacrylate), Poly(dimethylaminomethyl styrene), Poly(perfluoroalkyl ethyl methacrylate), Poly(ethylene glycol diacrylate), Poly(diethylene glycol divinyl ether), Poly(pentafluorophenyl methacrylate), Poly(methacrylic acid), Poly(propargyl methacrylate), Poly(1-vinyl-2-pyrrolidone), Poly(cyclohexyl methacrylate), Poly(tetravinyltetramethylcyclotetrasiloxane), Poly(1,3,5-trivinyl-1,1,3,5,5-pentamethyltrisiloxane), Poly(1,3-divinyl-1,1,3,3-tetramethyldisilazane), Poly(1,5-hexadiene-3,4-diol), Poly(ethyl acrylate), Poly(n-propyl acrylate), Poly(n-butyl acrylate), Poly(n-pentyl acrylate), Poly(n-hexyl acrylate), Poly(neopentyl acrylate), Poly(benzyl acrylate), Poly(isobornyl acrylate), Poly(2-(trimethylsilyloxy)ethyl acrylate), Poly(1,3-propanediol dimethacrylate), Poly(1,3-propanediol diacrylate), Poly(1H,1H,2H,2H-perfluoroocto acrylate), Poly(1H,1H,2H,2H-perfluorohexa acrylate), Poly(ortho-nitrobenzyl methacrylate), Poly(2-isocyanatoethyl methacrylate), Poly(n-vinylcaprolactam), Poly(N,N-1-diethylacrylamide), Poly(9-vinylcarbazole), Poly(9-vinylanthracene), Poly(methyl vinyl ether), Poly(1-amino-2-propanol), Poly((2-ethylamino)ethanol), Poly(glycerol dimethacrylate), Poly(tri(ethylene glycol)divinyl ether), Poly(alpha methyl styrene), Poly(meta methyl styrene), Poly(para methyl styrene), Poly(vinylimidazole), Poly(1,4-divinyloxybutane), Poly(N-morpholinoethyl acrylate), Poly(2-morpholinoethyl methacrylate), Poly(tetrahydrofurfuryl methacrylate), Poly(2-isocyanatoethyl methacrylate), Poly(2-sulfoethyl methacrylate), Poly(2-methoxyethyl methacrylate), Poly(2-(tert-butylamino)ethyl methacrylate), Poly(2-ethoxyethyl methacrylate), Poly(2-chloroethyl methacrylate), Poly(2-Hydroxypropyl methacrylate), Poly(2-diethylaminoethyl methacrylate), Poly(cyclopentyl methacrylate), Poly(2-(diisopropylamino)ethyl methacrylate), Poly(2-bromoethyl methacrylate), Poly(2-phenylethyl methacrylate, or copolymers thereof.

In certain embodiments, the invention relates to any one of the aforementioned compositions, wherein the first polymer comprises poly(4-vinylpyridine). In certain embodiments, the invention relates to any one of the aforementioned compositions, wherein the first polymer is poly(4-vinylpyridine).

In certain embodiments, the invention relates to any one of the aforementioned compositions, wherein the first polymer comprises poly(4-aminostyrene). In certain embodiments, the invention relates to any one of the aforementioned compositions, wherein the first polymer is poly(4-aminostyrene).

In certain embodiments, the invention relates to any one of the aforementioned compositions, wherein the second polymer comprises a polymer made from a photopolymerizable monomer. In certain embodiments, the invention relates to any one of the aforementioned compositions, wherein the second polymer comprises a polymer made from a photopolymerizable monomer selected from the group consisting of a diacetylene, ethylene glycol diacrylate, a methacrylate, a fumarate, a vinyl alcohol, a hyaluronic acid, dextran-methacrylate, 2-hydroxyethyl methacrylate, a photoreactive amino acid analog, and a photoreactive protein. In certain embodiments, the invention relates to any one of the aforementioned compositions, wherein the second polymer comprises a polymer made from 10,12-tricosadiynoic acid, 3,5-octadiyn-1-ol, 3,5-octadiyne-1,8-diol, 7,9-hexadecadiyne, 3,5-octadiyne-2,7-diol, 3,5-nonadiyn-2-one, 4,6-decadiyne-3,8-diol, 8-chloro-2-methyl-1-octene-3,5-diyne, 5,7-dodecadiyne-1,12-diol, 1,10-dichloro-4,6-decadiyne, 4,6-dodecadiynal, 9,11-hexadecadiyn-1-ol, 2,7-dimethyl-3,5-octadiyne-2,7-diol, 5,7-eicosadiyn-1-ol, 2,7-dimethyl-3,5-nonadiyne-2,7-diol, 3,5-docosadiyn-1-ol, 1-bromo-4,6-nonadecadiyne, 1,3-octadiyn-1-yl-benzene, 3,8-dimethyl-4,6-decadiyne-3,8-diol, N,N-diethyl-3,5-octadiyn-1-amine, 4,6-dodecadiynoic acid, 1,1'-(1,3-butadiyne-1,4-diyl)bis-cyclopropane, 10,12-pentacosadiyn-1-ol, 4,6-decadiynedioic acid, 1,3-decadiyn-1-yl-benzene, 3,3'-(1,3-butadiyne-1,4-diyl)bis-cyclopropene, 5,7-tetradecadiynoic acid, 1-bromo-10,12-pentacosadiyne, (9Z)-1,9-heptadecadiene-4,6-diyn-3-ol, 10,12-heptadecadiynoic acid, 4,6-heptadecadiynoic acid, 5,7-hexadecadiynoic acid, 3,5-octadecadiynoic acid, 10,12-octadecadiynoic acid, 5,7-dodecadiynedoioic acid, 5,7-octadecadiynoic acid, 6,8-nonadecadiynoic acid, 10,12,18-nonadecatrivnoic acid, 10,12,17-nonadecatriynoic acid, 10,12-heneicosadiynoic acid, 5,7-eicosadiynoic acid, 8,10-heneicosadiynoic acid, 5,7-docosadiynoic acid, 5,7-tetracosadiynoic acid, 2,3,8,9-tetramethyl-1,9-decadiene-4,6-diyne-3,8-diol, 10,12-pentacosadiynoic acid, 12,14-pentacosadiynoic acid, 10,12-heptacosadiynoic acid, 10,12- hexacosadiynoic acid, 12,14-heptacosadiynoic acid, $N^1,N^1,N^1,N^{10},N^{10},N^{10}$-hexamethyl-4,6-decadiyne-1,10-diaminium iodide, 10,12,18,20-tritriacontatetraynoic acid, 10,12-docosadiynedioic acid, 4,6-decadiynedioic acid 1,10-dimethyl ester, 10,12-tricosadivnoic acid methyl ester, 10,12-pentacosadiynoic acid methyl ester, 10,12-hexcosadiynoyl chloride, 4-(1,3-octadiyn-1-yl)-benzoic acid, 13-phenyl-10,12-tridecadiynoic acid, 1,1'-(1,3-butadiyne-1,4-diyl)bis[4-ethynylbenzene], 4,5,10,11-tetramethyl-2,4,10,12-tetradecatetraene-6,8-diynedioic acid, 10,12-docsadiynedioic acid 1,22-dimethyl ester, 3-(1,3-decadiyn-1-yl)-benzoic acid, 8-(3-heptyl-2-oxiranyl)-1-octene-4,6-diyn-3-ol, 3-(1,3-eicosadiyn-1-yl)-benzoic acid, N-hydroxy-13-phenyl-10,12-tridecadiynamide, 6-(3-heptyloxiranyl)-1-oxiranyl-2,4-hexadiyn-1-one, 1-nitro-4-(10,12-octadecadiyn-1-yloxy)-benzene, or 4-[5-[(1,1-dimethylpropyl)dioxy]-5-methyl-1,3-hexadiyn-1-yl]-benzoic acid. In certain embodiments, the invention relates to any one of the aforementioned compositions, wherein the second polymer is a polymer made from 10,12-tricosadiynoic acid.

In certain embodiments, the invention relates to any one of the aforementioned compositions, wherein the first polymer is covalently bonded to the second polymer. In certain embodiments, the invention relates to any one of the aforementioned compositions, wherein the first polymer is hydrogen bonded to the second polymer.

In certain embodiments, the invention relates to any one of the aforementioned compositions, wherein the substrate is homogeneous.

In certain embodiments, the invention relates to any one of the aforementioned compositions, wherein the substrate is heterogeneous.

In certain embodiments, the invention relates to any one of the aforementioned compositions, wherein the substrate is planar or non-planar.

In certain embodiments, the invention relates to any one of the aforementioned compositions, wherein the substrate is planar.

In certain embodiments, the invention relates to any one of the aforementioned compositions, wherein the substrate is non-planar.

In certain embodiments, the invention relates to any one of the aforementioned compositions, wherein the substrate is glass, plastic, silicon, woven or non-woven fabric, quartz, or paper.

In certain embodiments, the invention relates to any one of the aforementioned compositions, wherein the substrate is glass.

In certain embodiments, the invention relates to any one of the aforementioned compositions, wherein the substrate is plastic.

In certain embodiments, the invention relates to any one of the aforementioned compositions, wherein the substrate is silicon.

In certain embodiments, the invention relates to any one of the aforementioned compositions, wherein the substrate is quartz.

In certain embodiments, the invention relates to any one of the aforementioned compositions, wherein the substrate is paper.

In certain embodiments, the invention relates to any one of the aforementioned compositions, wherein the surface of the substrate is concave or convex.

In certain embodiments, the invention relates to any one of the aforementioned compositions, wherein the surface of the substrate is irregular.

In certain embodiments, the invention relates to any one of the aforementioned compositions, wherein the substrate is a glass rod. In certain embodiments, the invention relates to any one of the aforementioned compositions, wherein the substrate is a glass rod with a diameter of from about 1 mm to about 10 mm. In certain embodiments, the invention relates to any one of the aforementioned compositions, wherein the substrate is a glass rod with a diameter of about 1 mm, about 2 mm, about 3 mm, about 4 mm, about 5 mm, about 6 mm, about 7 mm, about 8 mm, about 9 mm, or about 10 mm.

Another aspect of the invention relates to the composition obtained by the process of any one of methods discussed below.

Methods of the Invention

In certain embodiments, the invention relates to a method of making a composition, comprising the steps of:
providing a substrate;
coating a surface of the substrate with a first polymer, thereby forming a coated surface of the substrate;
contacting the coated surface of the substrate with a photopolymerizable monomer, thereby forming a photopolymerizable surface of the substrate;
masking with a mask a portion of the photopolymerizable surface of the substrate, thereby forming an exposed portion of the photopolymerizable surface of the substrate and a masked portion of the photopolymerizable surface of the substrate;
exposing the exposed portion of the photopolymerizable surface of the substrate to radiation at a wavelength for a first period of time, thereby forming a coating material on the exposed portion of the surface of the substrate;
removing the mask, thereby exposing the masked portion of the photopolymerizable surface of the substrate; and
removing the masked portion of the photopolymerizable surface of the substrate, thereby forming the composition,
wherein the composition comprises the substrate and the coating material; and the coating material coats a portion of the surface of the substrate, thereby forming a feature comprising the coating material on the surface of the substrate.

In certain embodiments, the invention relates to a method of making a composition, comprising the steps of:
providing a substrate;
coating a surface of the substrate with a third polymer, thereby forming a third polymer-coated surface of the substrate;
coating the third polymer-coated surface of the substrate with a first polymer, thereby forming a first polymer-coated surface of the substrate;
contacting the first polymer-coated surface of the substrate with a photopolymerizable monomer, thereby forming a photopolymerizable surface of the substrate;
masking with a mask a portion of the photopolymerizable surface of the substrate, thereby forming an exposed portion of the photopolymerizable surface of the substrate and a masked portion of the photopolymerizable surface of the substrate;
exposing the exposed portion of the photopolymerizable surface of the substrate to radiation at a wavelength for a first period of time, thereby forming a coating material on the exposed portion of the surface of the substrate;
removing the mask, thereby exposing the masked portion of the photopolymerizable surface of the substrate; and
removing the masked portion of the photopolymerizable surface of the substrate, thereby forming the composition, wherein the composition comprises the substrate, the third polymer, and the coating material; the third polymer coats the surface of the substrate; and the coating material coats a portion of the third polymer-coated surface of the substrate, thereby forming a feature comprising the coating material on the third polymer-coated surface of the substrate.

In certain embodiments, the invention relates to any one of the aforementioned methods, wherein coating the surface of the substrate comprises initiated chemical vapor deposition (iCVD) of the third polymer in a deposition chamber. In certain embodiments, the pressure of the deposition chamber is about 0.05 Torr to about 1.5 Torr. In certain embodiments, the pressure of the deposition chamber is about 0.1 Torr, about 0.2 Torr, about 0.3 Torr, about 0.4 Torr, about 0.5 Torr, about 0.6 Torr, about 0.7 Torr, about 0.8 Torr, about 0.9 Torr, about 1.0 Torr, about 1.1 Torr, about 1.2 Torr, about 1.3 Torr, about 1.4 Torr, or about 1.5 Torr In certain embodiments, the invention relates to any one of the aforementioned methods, wherein coating the surface of the substrate comprises initiated chemical vapor deposition (iCVD) of the first polymer in a deposition chamber. In certain embodiments, the pressure of the deposition chamber is about 0.05 Torr to about 1.5 Torr. In certain embodiments, the pressure of the deposition chamber is about 0.1 Torr, about 0.2 Torr, about 0.3 Torr, about 0.4 Torr, about 0.5 Torr, about 0.6 Torr, about 0.7 Torr, about 0.8 Torr, about 0.9 Torr, about 1.0 Torr, about 1.1 Torr, about 1.2 Torr, about 1.3 Torr, about 1.4 Torr, or about 1.5 Torr.

In certain embodiments, the invention relates to any one of the aforementioned methods, wherein contacting the first polymer-coated surface of the substrate comprises substantially submerging the first polymer-coated surface of the substrate in a solution of the photopolymerizable monomer for a third period of time. In certain embodiments, the invention relates to any one of the aforementioned methods, wherein contacting the first polymer-coated surface of the substrate comprises substantially submerging the first polymer-coated surface of the substrate in a solution of the photopolymerizable monomer for a third period of time and stirring the solution. In certain embodiments, the concentration of the photopolymerizable monomer in the solution is about 0.5 wt % to about 5.0 wt %. In certain embodiments, the concentration of the photopolymerizable monomer in the solution is about 0.5 wt %, about 1.0 wt %, about 1.5 wt %, about 2.0 wt %, about 2.5 wt %, about 3.0 wt %, about 4.0 wt %, about 4.5 wt %, or about 5.0 wt %.

In certain embodiments, the invention relates to any one of the aforementioned methods, wherein the solution of the photopolymerizable monomer is a solution in toluene, hexanes, 1,4-dioxane, chloroform, or diethyl ether.

In certain embodiments, the invention relates to any one of the aforementioned methods, wherein contacting the first polymer-coated surface of the substrate comprises subliming the photopolymerizable monomer onto the first polymer-coated surface.

In certain embodiments, the invention relates to any one of the aforementioned methods, wherein the third period of time is about 0.5 h, about 1.0 h, about 1.5 h, about 2.0 h, or about 2.5 h.

In certain embodiments, the invention relates to any one of the aforementioned methods, wherein contacting the first polymer-coated surface of the substrate comprises subliming the photopolymerizable monomer onto the first polymer-coated surface.

In certain embodiments, the invention relates to any one of the aforementioned methods, wherein the first polymer is transformed into a photopolymerizable polymer by contacting with a photopolymerizable monomer.

In certain embodiments, the invention relates to any one of the aforementioned methods, wherein the first polymer is a co-polymer.

In certain embodiments, the invention relates to any one of the aforementioned methods, further comprising the step of:
  drying the photopolymerizable surface of the substrate.

In certain embodiments, the invention relates to any one of the aforementioned methods, wherein the photopolymerizable surface of the substrate is dried with a stream of clean, dry air.

In certain embodiments, the invention relates to any one of the aforementioned methods, wherein the mask comprises glass or metal. In certain embodiments, the invention relates to any one of the aforementioned methods, wherein the mask comprises copper.

In certain embodiments, the invention relates to any one of the aforementioned methods, wherein the wavelength is about 254 nm.

In certain embodiments, the invention relates to any one of the aforementioned methods, wherein the first period of time is about 1 min to about 10 min. In certain embodiments, the invention relates to any one of the aforementioned methods, wherein the first period of time is about 1 min, about 2 min, about 3 min, about 4 min, about 5 min, about 6 min, about 7 min, about 8 min, about 9 min, or about 10 min.

In certain embodiments, the invention relates to any one of the aforementioned methods, wherein the irradiation at the exposed portion of the photopolymerizable surface of the substrate is about 100 $\mu W/cm^2$ to about 500 $\mu W/cm^2$. In certain embodiments, the invention relates to any one of the aforementioned methods, wherein the irradiation at the exposed portion of the photopolymerizable surface of the substrate is about 120 $\mu W/cm^2$, about 150 $\mu W/cm^2$, about 180 $\mu W/cm^2$, about 210 $\mu W/cm^2$, about 240 $\mu W/cm^2$, about 270 $\mu W/cm^2$, about 300 $\mu W/cm^2$, about 330 $\mu W/cm^2$, about 400 $\mu W/cm^2$, about 450 $\mu W/cm^2$, or about 500 $\mu W/cm^2$.

In certain embodiments, the invention relates to any one of the aforementioned methods, wherein the masked portion of the photopolymerizable surface of the substrate is removed by contacting the masked portion of the photopolymerizable surface with a solvent for a fourth period of time. In certain embodiments, the invention relates to any one of the aforementioned methods, wherein the masked portion of the photopolymerizable surface of the substrate is removed by contacting the masked portion of the photopolymerizable surface with methanol, ethanol, propanol, or butanol.

In certain embodiments, the invention relates to any one of the aforementioned methods, wherein the fourth period of time is about 1 s to about 10 min. In certain embodiments, the invention relates to any one of the aforementioned methods, wherein the fourth period of time is about 1 s, about 2 s, about 3 s, about 4 s, about 5 s, about 6 s, about 7 s, about 8 s, about 9 s, about 10 s, about 15 s, about 20 s, about 25 s, about 30 s, about 45 s, about 60 s, about 75 s, about 90 s, about 120 s, about 150 s, about 3 min, about 4 min, about 5 min, about 6 min, about 7 min, about 8 min, about 9 min, or about 10 min.

In certain embodiments, the invention relates to any one of the aforementioned methods, further comprising the step of:
  drying the composition.

In certain embodiments, the invention relates to any one of the aforementioned methods, further comprising the steps of:
  exposing the surface of the composition to oxygen plasma for a second period of time at a pressure, thereby conditioning the surface and the features;

evaporating a metal onto the surface and the features, thereby forming a metal-coated surface and metal-coated features; and removing the metal-coated features.

In certain embodiments, the invention relates to any one of the aforementioned methods, wherein the second period of time is about 2 s to about 3 min. In certain embodiments, the invention relates to any one of the aforementioned methods, wherein the second period of time is about 2 s, about 3 s, about 4 s, about 5 s, about 6 s, about 7 s, about 8 s, about 9 s, about 10 s, about 11 s, about 12 s, about 13 s, about 14 s, about 15 s, about 16 s, about 17 s, about 18 s, about 19 s, about 20 s, about 25 s, about 30 s, about 35 s, about 40 s, about 45 s, about 50 s, about 55 s, about 60 s, about 90 s, about 120 s, about 150 s, or about 3 min.

In certain embodiments, the invention relates to any one of the aforementioned methods, wherein the flow rate of oxygen is about 10 sccm to about 100 sccm. In certain embodiments, the invention relates to any one of the aforementioned methods, wherein the flow rate of oxygen is about 10 sccm, about 20 sccm, about 30 sccm, about 40 sccm, about 50 sccm, about 60 sccm, about 70 sccm, about 80 sccm, about 90 sccm, or about 100 sccm.

In certain embodiments, the invention relates to any one of the aforementioned methods, wherein the pressure is about 5 mTorr to about 50 mTorr. In certain embodiments, the invention relates to any one of the aforementioned methods, wherein the pressure is about 5 mTorr, about 10 mTorr, about 15 mTorr, about 20 mTorr, about 25 mTorr, about 30 mTorr, about 35 mTorr, about 40 mTorr, about 45 mTorr, or about 50 mTorr.

In certain embodiments, the invention relates to any one of the aforementioned methods, wherein the plasma is generated by applying about 100 W to about 300 W. In certain embodiments, the invention relates to any one of the aforementioned methods, wherein the plasma is generated by applying about 100 W, about 125 W, about 150 W, about 175 W, about 200 W, about 225 W, about 250 W, about 275 W, or about 300 W.

In certain embodiments, the invention relates to any one of the aforementioned methods, wherein the metal is Cr, Ti, or Au. In certain embodiments, the invention relates to any one of the aforementioned methods, wherein the metal is Cr and Au. In certain embodiments, the invention relates to any one of the aforementioned methods, wherein the metal is Ti and Au.

In certain embodiments, the invention relates to any one of the aforementioned methods, wherein the metal is deposited at a rate of about 0.2 to about 5 nm/s. In certain embodiments, the invention relates to any one of the aforementioned methods, wherein the metal is deposited at a rate of about 0.5 to about 2 nm/s. In certain embodiments, the invention relates to any one of the aforementioned methods, wherein the metal is deposited at about $1 \text{ e}^{-6}$ mbar.

In certain embodiments, the invention relates to any one of the aforementioned methods, wherein the thickness of the metal coating is about 1 nm to about 100 nm. In certain embodiments, the invention relates to any one of the aforementioned methods, wherein the thickness of the metal coating is about 1 nm, about 2 nm, about 3 nm, about 4 nm, about 5 nm, about 6 nm, about 7 nm, about 8 nm, about 9 nm, about 10 nm, about 11 nm, about 12 nm, about 13 nm, about 14 nm, about 15 nm, about 20 nm, about 25 nm, about 30 nm, about 35 nm, about 40 nm, about 45 nm, about 50 nm, about 60 nm, about 70 nm, about 80 nm, about 90 nm, or about 100 nm.

In certain embodiments, the invention relates to any one of the aforementioned methods, wherein the metal-coated features are removed by contacting the composition with a solution. In certain embodiments, the solution is about 3/1 95% sulfuric acid/30% hydrogen peroxide. In certain embodiments, this step is followed by ultrasonication.

In certain embodiments, the invention relates to any one of the aforementioned methods, further comprising the step of:
rinsing the surface with metal features.

In certain embodiments, the invention relates to any one of the aforementioned methods, further comprising the step of:
dusting the surface with metal features.

In certain embodiments, the invention relates to any one of the aforementioned methods, further comprising the step of:
drying the surface with metal features.

In certain embodiments, the invention relates to any one of the aforementioned methods, wherein a plurality of substrates is processed substantially simultaneously.

In certain embodiments, the invention relates to any one of the aforementioned methods, wherein the method is completed in less than about 5 h, less than about 4 h, less than about 3 h, less than about 2 h, or less than about 1 h. In certain embodiments, the invention relates to any one of the aforementioned methods, wherein the method is completed in about 0.5 h, about 1 h, about 1.5 h, or about 2 h.

Applications and Articles of the Invention

Patterning processes for functional polymeric materials play an important role in the fabrication of microelectronic devices. As described herein, the ability to deposit polymeric features on non-planar surfaces will expand its utility in devices and enable the development of new devices.

In certain embodiments, the invention relates to an article comprising any one of the aforementioned compositions.

In certain embodiments, the invention relates to any one of the aforementioned articles, wherein the article is, or is incorporated into, a sensor (for example, a biomimetic pressure sensor), an imaging display, an optical device (such as a diffraction grating or a photonic crystal), or a hemispherical or ellipsoidal camera with reduced aberration and wider field of view.

EXEMPLIFICATION

The invention now being generally described, it will be more readily understood by reference to the following examples, which are included merely for purposes of illustration of certain aspects and embodiments of the invention, and are not intended to limit the invention.

General Procedures

Materials and Characterization

Reactants and solvents were purchased from Sigma-Aldrich and used as received. Silicon substrates were obtained from Wafer World, Inc. Planar glass substrates and curved glass lenses were obtained from VWR International. Glass rods were purchased from McMaster-Carr. Fourier transform infrared spectroscopy (FTIR) spectra were obtained using a Nicolet Nexus 870 spectrometer operated in transmission mode with a deuterated triglycine sulfate (DTGS) KBr detector. Baseline-corrected spectra were collected over 400-4000 $cm^{-1}$ at 4 $cm^{-1}$ resolution and averaged over 256 scans. Raman spectra were obtained using a Kaiser Hololab 5000R confocal Raman spectrometer equipped with a 785 nm Invictus diode laser. The optical absorption of the thin films was characterized using a Cary 5000 UV-vis spectrophotometer. Film thicknesses for as-deposited polymer thin films were obtained using a JA Woollam M-2000 variable angle spectroscopic ellipsometer at incident angles of 65, 70, and 75°; data were fit to a Cauchy-Urbach isotropic model using WVASE32 modeling software (JA Woollam). Thickness measurements used to calculate resist sensitivity were obtained using a Veeco Dektak 150 surface profilometer. Contact angle measurements were taken using a Rame-Hart Model 500 goniometer with an automatic dispenser and 4 µL DI water droplets. Images of the patterns were obtained using an Olympus CX-41 optical microscope equipped with a DP12-2 image recorder and a Hitachi TM-3000 scanning electron microscope. Measurements of feature sizes were obtained for three features in each image using the MeasureIT software package.

Polymer Synthesis

P4VP thin films were deposited using an iCVD reactor previously described. Tenhaeff, W. E. et al., *Langmuir*, vol. 23, no. 12, pp. 6624-6630, 2007. 4-vinylpyridine (4VP, 95%) monomer was heated to 55° C. and delivered to the reactor via a heated mass flow controller (MKS instruments, 1152C) at a rate of 9 sccm. tert-Butyl peroxide (TBPO, 98%) was delivered via a mass flow controller (MKS Instruments, 1479) at ambient temperature and a rate of 3 sccm. The Chromaloy O (Goodfellow) filament array was maintained at 210° C. An operating pressure of 800 mTorr and substrate temperature of 20° C. were used for all depositions. P4VP film growth was monitored via in situ interferometry using a 633-nm HeNe laser (JDS Uniphase).

Polymer Functionalization and Patterning

P4VP films were submerged in a 1 wt % solution of 10,12-tricosadiynoic acid in toluene and gently stirred. After 1 h, the films were removed from the solution and dried with a stream of clean, dry air. Patterning was accomplished by placing a mask of the desired pattern onto the functionalized P4VP and exposing for 4 minutes at 254 nm with a UVG-54 handheld UV lamp (Ultra Violet Products). The irradiation at the surface of the film was approximately 170 µW/cm$^2$, as measured with a J-225 Blak-Ray UV intensity meter. Patterns were developed by dipping the exposed films in ethanol for 5 s, followed by drying with clean, dry air.

The P4VP-PPFDA bifunctional surface was created by depositing 200 nm of P4VP onto a silicon substrate previously coated with 35 nm of iCVD PPFDA. The sample was masked, exposed and developed as described above.

Patterning of metal structures was achieved by patterning P4VP as described above, then exposing the patterned polymer to oxygen plasma in a Unaxis reactive-ion etching system for 12 s (40 sccm O$_2$, 20 mTorr, 200 W). Next, 5 nm Cr and 10 nm Au were deposited using an Edwards thermal evaporator operated at rates of 0.5-2 nm/s at 1 e$^{-6}$ mbar. Lift-off of the underlying polymer was accomplished by submerging the metal-coated sample in a piranha bath (3/1 95% sulfuric acid/30% hydrogen peroxide) for 2 min, ultrasonicating for 20 s after 1 min. The sample was then rinsed with DI water, brushed with a lint-free swab, and dried with nitrogen gas.

Interaction Parameter Calculation: iCVD P4VP and PTDA

As a first-order approximation to assess the miscibility of PTDA and P4VP, we use Flory-Huggins theory, as applied to polymer blends (neglecting solvent effects). The polymer-polymer interaction parameter, $\chi$, can be calculated using:

$$\chi = \frac{V_r}{RT}(\delta_{P4VP} - \delta_{PTDA})^2$$

where $V_r$ is a reference molar volume assumed to be 100 cm$^3$, R is the ideal gas constant, T is the system temperature (25° C.), and $\delta_{P4VP}$ and $\delta_{PTDA}$ are the solubility parameters of iCVD P4VP and PTDA, respectively. We previously determined $\delta_{P4VP}$ to be 19.3 MPa$^{0.5}$, while Wu and coworkers calculated a value of 15.3 MPa$^{0.5}$ for $\delta_{PTDA}$. The resulting value for $\chi$ is 0.65. In order for the polymers to be miscible, $\chi$ must be less than the critical value, $\chi_c$:

$$\chi_c = \frac{1}{2}\left(\frac{1}{\sqrt{N_{P4VP}}} + \frac{1}{\sqrt{N_{PTDA}}}\right)^2$$

where $N_{P4VP}$ and $N_{PTDA}$ are the degrees of polymerization of P4VP and PTDA, respectively. $N_{P4VP}$ was previously determined to be 62.8. $N_{PTDA}$ is difficult to measure due to the insolubility of PTDA; therefore, as a limiting case, we assume $N_{PTDA}=1$. The resulting $\chi_c$ is 0.63, which implies that the polymers are poorly miscible and interpenetration between species is low.

Results and Discussion

Synthesis and Functionalization of iCVD P4VP

Figure 2:
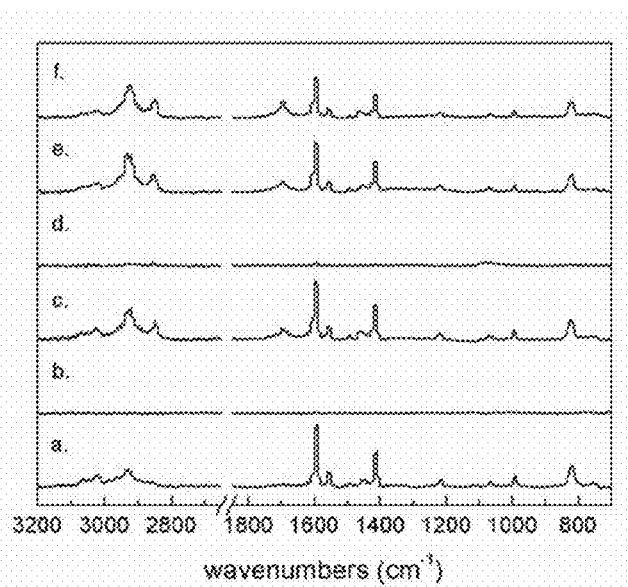
FIG. 2 depicts FTIR spectra of (a) iCVD P4VP, (b) P4VP soaked in ethanol, (c) P4VP-TDA, (d) P4VP-TDA soaked in ethanol, (e) P4VP-PTDA after UV exposure, and (f) P4VP-PTDA after UV exposure and soaking in ethanol.
Figure 3:
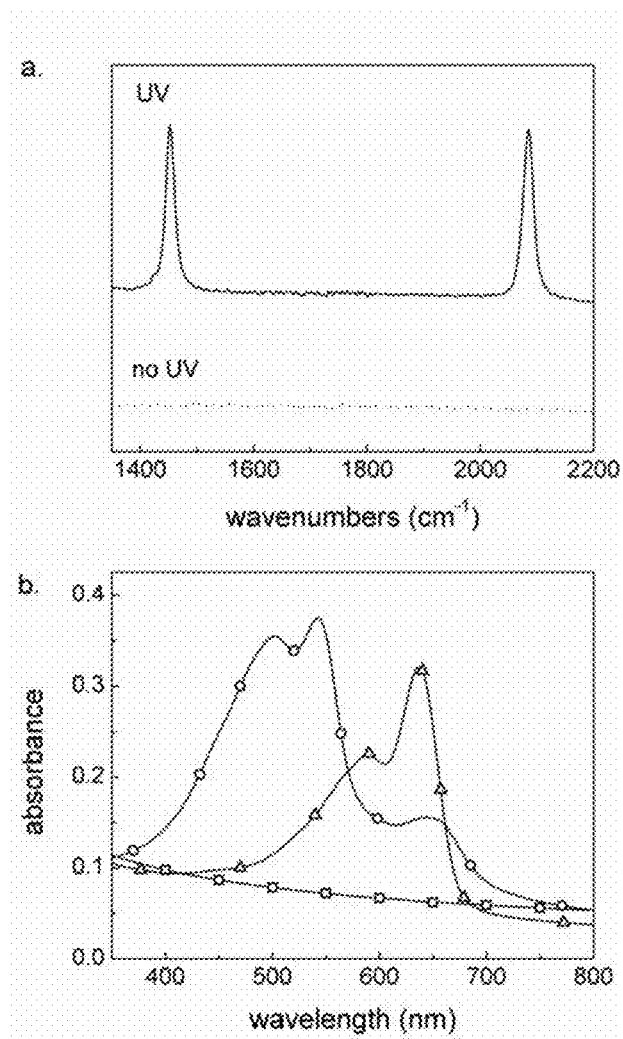
FIG. 3 depicts (a) Raman spectra of TDA-functionalized P4VP before and after UV exposure, and (b) UV-visible spectra of P4VP-TDA (□), P4VP-PTDA before (Δ) and after (○) developing in ethanol.
Figures 10, 11:
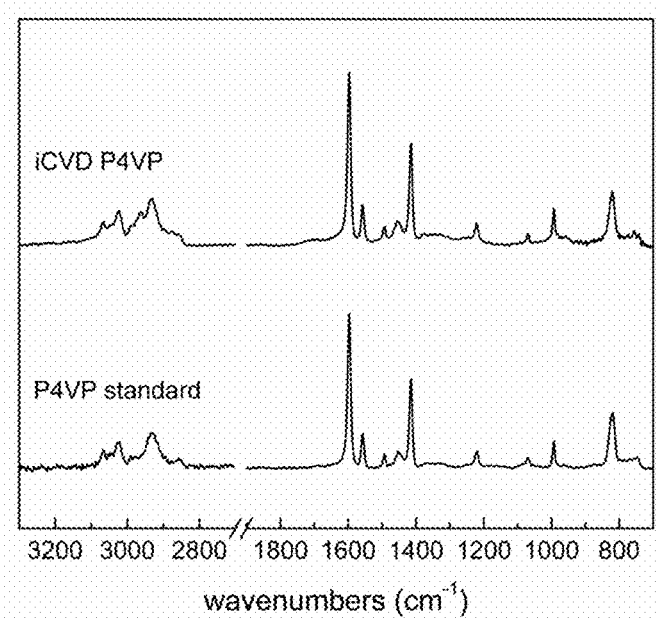
FIG. 10 tabulates static water contact angles for PPFDA, P4VP-PTDA, and iCVD P4VP surfaces.
FIG. 11 depicts FTIR spectra of iCVD P4VP and a P4VP standard.

Fourier transform infrared (FTIR) spectroscopy data indicate that as-deposited iCVD P4VP is functionally identical to a commercial P4VP standard (FIG. 11). Peaks at 1597, 1557, 1493, 1453, and 1415 cm$^{-1}$ are assigned to vibration of the pyridine ring, with in- and out-of-plane CH deformations observed at 1070 and 823 cm$^{-1}$, respectively (FIG. 2a). Symmetric and asymmetric CH$_2$ and CH$_3$ stretching is visible between 2860-2960 cm$^{-1}$, and stretching vibrations of the pyridine ring are observed at 3025 cm$^{-1}$. FTIR spectra were collected during the TDA functionalization process to describe the solubility and functionality of the modified P4VP. As seen in FIG. 2b, iCVD P4VP thin films, like bulk P4VP, are extremely soluble in solvents that act as Lewis acids, such as ethanol. After functionalizing with TDA (FIG. 2c), a peak due to the hydrogen-bonded carboxylic acid groups is observed at 1693 cm$^{-1}$. The heights of peaks found at 2850 and 2920 cm$^{-1}$ also increase as a result of TDA functionalization; these peaks can be attributed to symmetric and asymmetric stretching of the sp$^3$-bonded CH$_2$ groups found in the TDA side chains. Prior to UV exposure, the functionalized film is still soluble in ethanol (FIG. 2d.). The spectra for the exposed sample (FIG. 2e) appears identical to that for the unexposed sample (FIG. 2c), as the C≡C and C═C bonds of TDA and PTDA exhibit weak IR absorption. Photopolymerization of the TDA molecules is suggested by the insolubility of the exposed film in ethanol (FIG. 2f) and confirmed by Raman and UV-visible spectroscopy (FIGS. 3a and b, respectively). In FIG. 3a, peaks due to stretching of the C≡C and C═C bonds in the polydiacetylene backbone are observed at 2084 and 1454 cm$^{-1}$, respectively. These peaks are not observed prior to irradiation. UV-visible spectroscopy data (FIG. 3b) confirms that functionalized, unexposed P4VP (P4VP-TDA) does not absorb in the range of 350-800 nm. After UV exposure, the sample exhibits the characteristic peak of the polydiacetylene at 640 nm. Solvatochromaticism is also observed; the color of the sample changes from blue to red upon washing in ethanol, and the UV-visible spectrum of the washed film exhibits the corresponding peak at 545 nm.

Patterning Functional Polymer Thin Films

Planar Substrates

Figure 4:
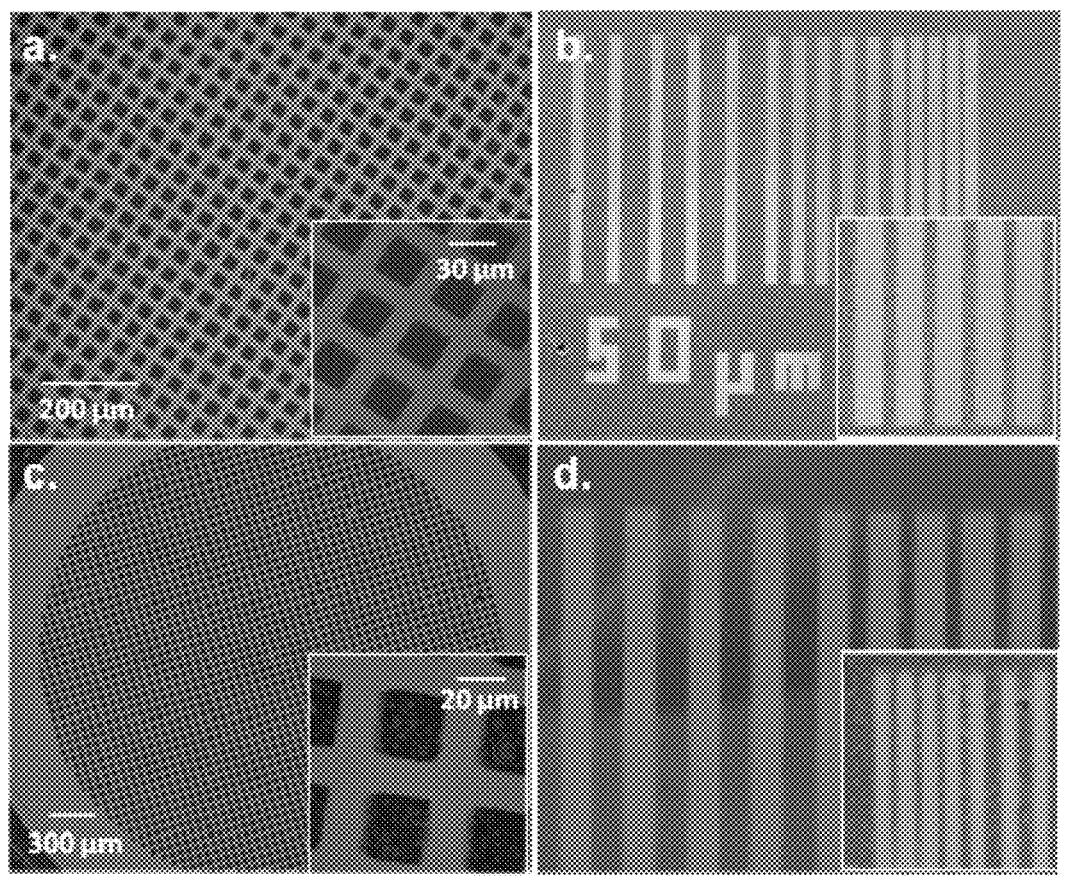
FIG. 4 depicts SEM and optical microscopy images of (a) 200 nm-thick P4VP-PTDA, (b) 150 nm-thick P4VP-PTDA (line widths in the image and inset are 50 μm), (c) 100 nm-thick P4VP-PTDA, and (d) 40 nm-thick P4VP-PTDA (line widths in the image and inset are 50 and 10 μm, respectively). Insets in (a), (b), and (c) are enlarged versions of the same sample; the inset in (d) is from the same batch of P4VP- PTDA. Films shown in (a) and (c) were patterned with a TEM grid; films shown in (b) and (d) were pattered using a glass photo mask. All films were deposited on planar silicon.

P4VP films of various thicknesses were functionalized with TDA, masked with copper transmission electron microscopy (TEM) grids or glass photo masks, exposed at 254 nm and developed in ethanol. The resulting patterns are shown in FIG. 4. Patterning was successfully achieved using films with thicknesses ranging from 200 nm to less than 50 nm and both types of masks. As shown in FIG. 4, the patterns obtained are clearly defined and uniform over large areas. Feature sizes shown range from 50 µm (FIG. 4b) to less than 3 µm (FIG. 4d, inset). Table 1 compares the size of the patterned features (unexposed regions) to mask feature size.

TABLE 1

| Figure | Average Patterned Feature Size$^a$ [µm] | Mask Feature Size [µm] |
|---|---|---|
| 4a | 15.1 ± 0.5 | 15 |
| 4b | 50.1 ± 0.7 | 50 |
| 4c | 14.6 ± 0.2 | 15 |
| 4d (inset) | 9.8 ± 0.1 | 10 |
| 6a | 45.5 ± 3.0 | 45 |
| 6b | 43.8 ± 2.4 | 45 |
| 6c | 46.2 ± 3.3 | 45 |

$^a$Error represents standard deviation.

Figure 5:
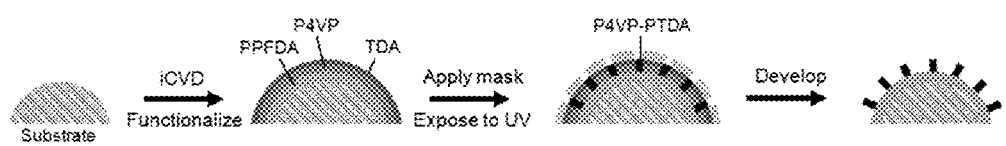
FIG. 5 depicts a graphical scheme showing a patterning process for bifunctional polymer surfaces.
Figure 12:
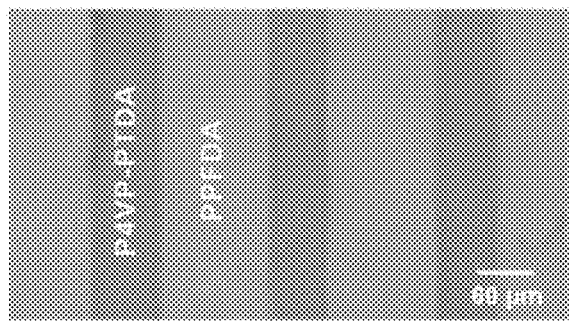
FIG. 12 depicts a bifunctional P4VP-PTDA surface, and a PPFDA surface.
Figure 13:
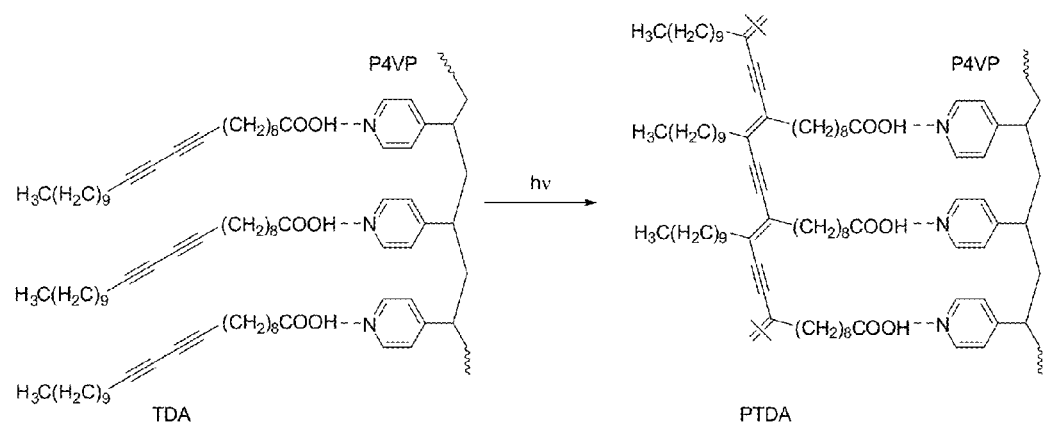
FIG. 13 depicts schematically an exemplary polymer (poly (4-vinylpyridine); P4VP) deposited by iCVD and then functionalized with an exemplary photoreactive species (10,12-tricosadiynoic acid; TDA) (to the left of the horizontal arrow); and the polymeric structure resulting from UV exposure of that system (to the right of the horizontal arrow).
Figure 14:
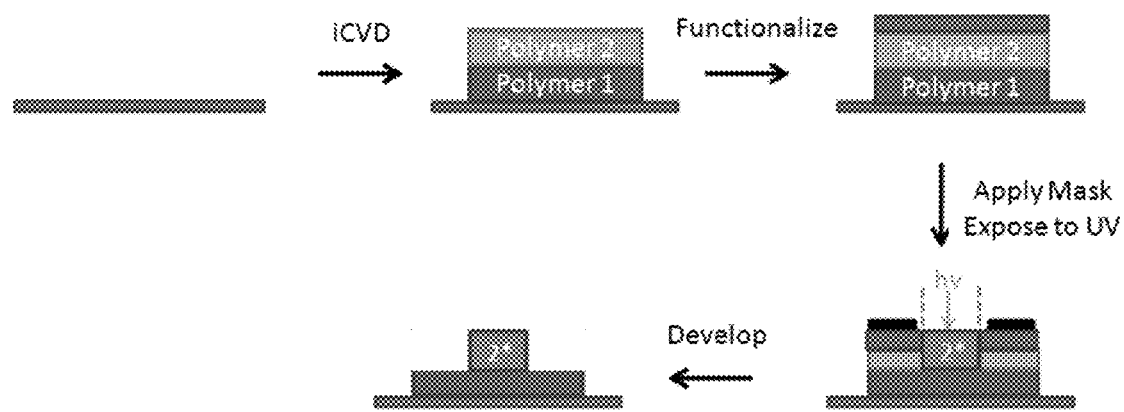
FIG. 14 depicts graphically the fabrication and patterning of multifunctional surfaces. For example, polymer 1 is hydrophobic (e.g., PPFDA), polymer 2 is hydrophilic (e.g., P4VP), and 2* represents cross-linked polymer 2 (hydrophilic) (e.g., P4VP-PTDA).
Figure 15:
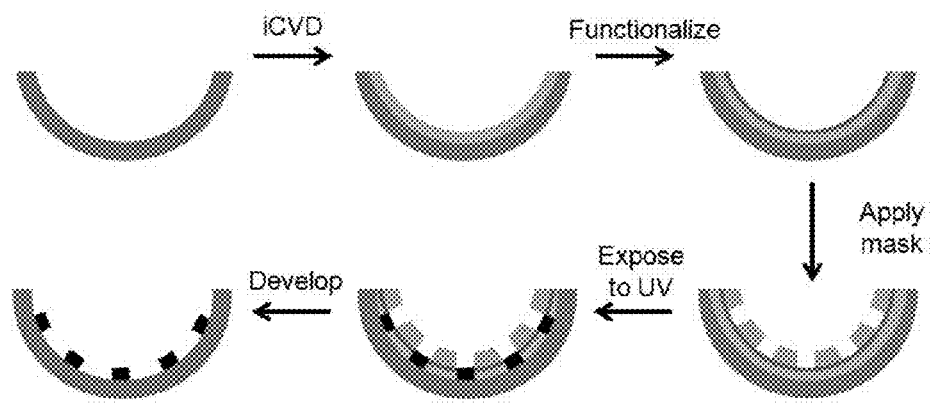
FIG. 15 depicts a schematic representation of an approach to patterning on a concave surface.
Figure 16:
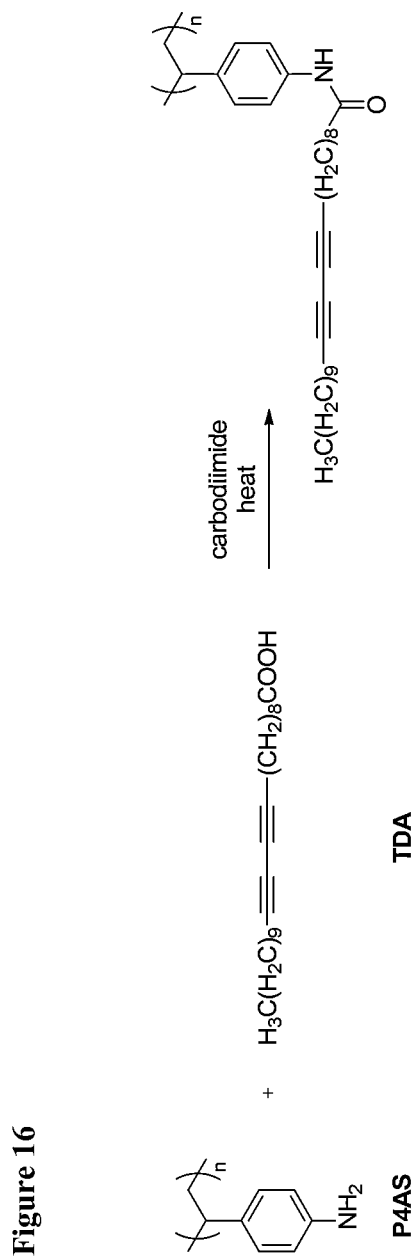
FIG. 16 depicts an example of a polymer-photoreactive species pair for use in an embodiment of the invention. Here, the photoreactive species (TDA) is covalently bonded to the iCVD polymer (poly(4-aminostyrene); PAS or P4AS).
Figure 17:
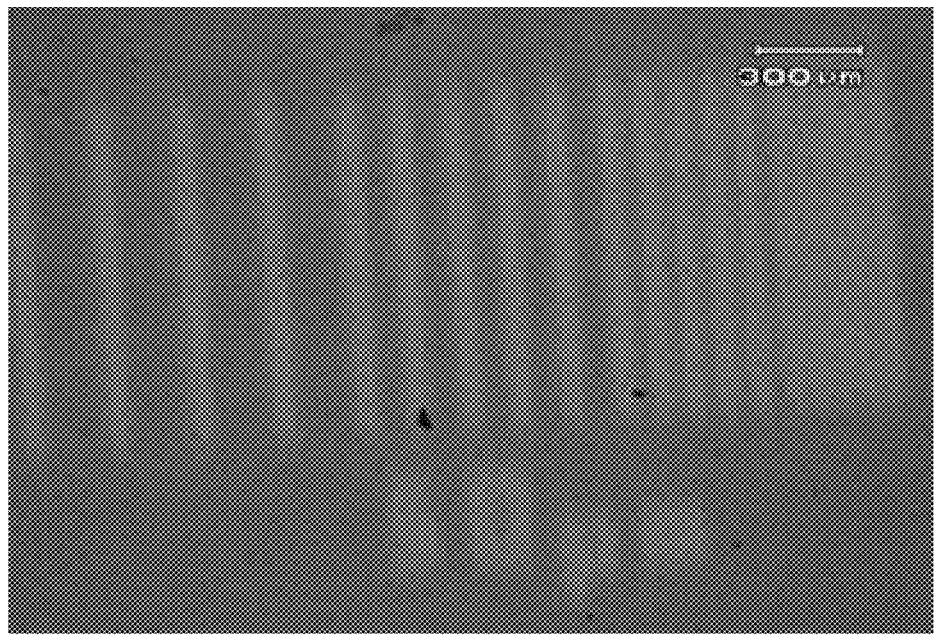
FIG. 17 depicts images of patterns formed from (a) non-functionalized P4AS, and (b) functionalized P4AS-PTDA. Differences include reduced surface roughness of (b) in comparison to (a), in part because excess TDA can be rinsed from the surface in the fabrication process leading for (b).
Figure 17:
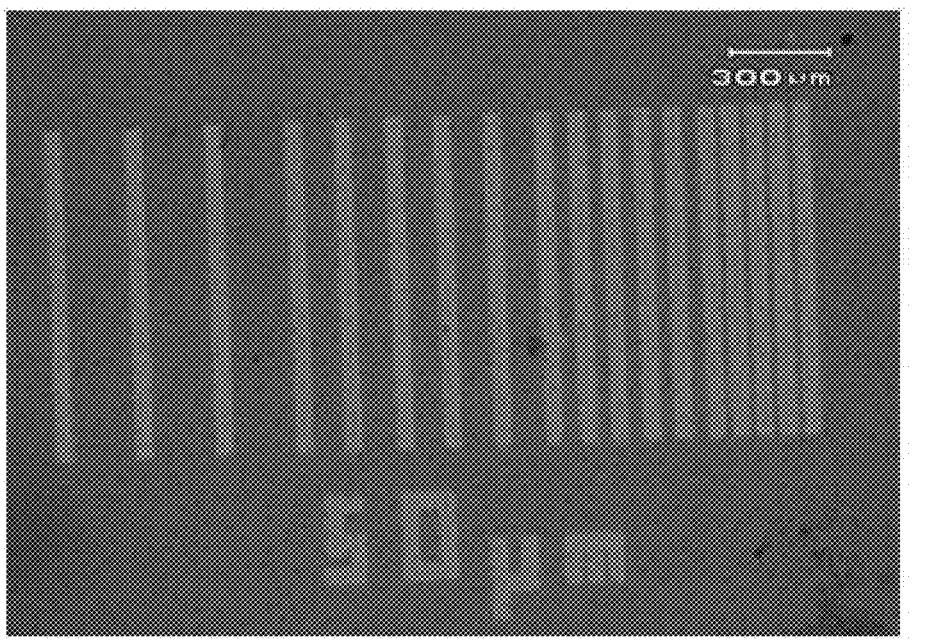

Bifunctional polymer surfaces can also be patterned using the P4VP-PTDA resist. See FIG. 14. Alternating regions of a hydrophobic fluoropolymer, poly(1H,1H,2H,2H-perfluorodecyl acrylate) (PPFDA) and comparatively hydrophilic P4VP-PTDA were patterned using the method depicted in FIG. 5. A representative SEM image of a surface with 60-µm features is shown in FIG. 12. Fabrication of the bifunctional surface was confirmed by measuring the static contact angles of water droplets in the PPFDA and P4VP-PTDA regions of the pattern (FIG. 10). As expected, a hydrophobic contact angle is observed for the fluoropolymer region, while the contact angle measured in the P4VP-PTDA region indicates hydrophilicity and is comparable to results obtained for unmodified iCVD P4VP.

Non-Planar (Curved) Substrates

Figure 6:
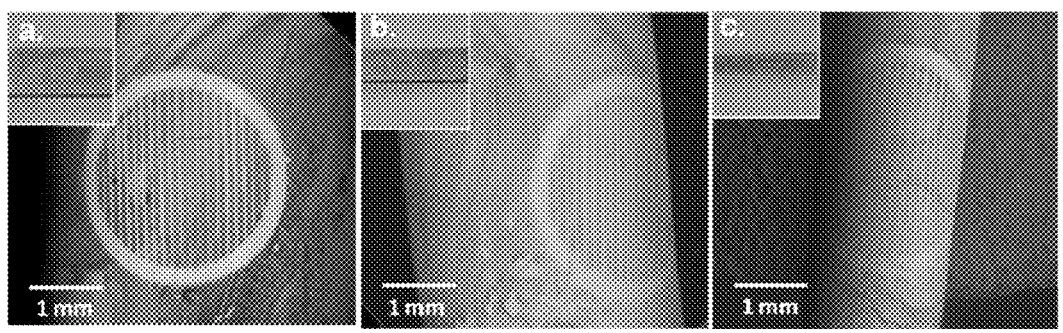
FIG. 6 depicts P4VP-PTDA patterned on glass rods with diameters of (a) 6 mm, (b) 4 mm, and (c) 2 mm.

The use of iCVD affords great versatility to this patterning method, as the conformality and retention of functionality attained via the iCVD process ensure that P4VP can be successfully coated on non-planar substrates and subsequently functionalized with PTDA. Glass rods with diameters ranging from 2 to 6 mm were coated with P4VP-PTDA as shown in FIG. 1. A flexible mask was applied to the surface of the rod, and the resist was exposed, then developed, resulting in the patterns observed in FIG. 6. Clearly-defined features are observed over the entirety of the surface; additionally, the radii of curvature of these substrates far exceeds what can be successfully coated and patterned using conventional photolithographic methods.

Patterning Metal Features

Figure 7:
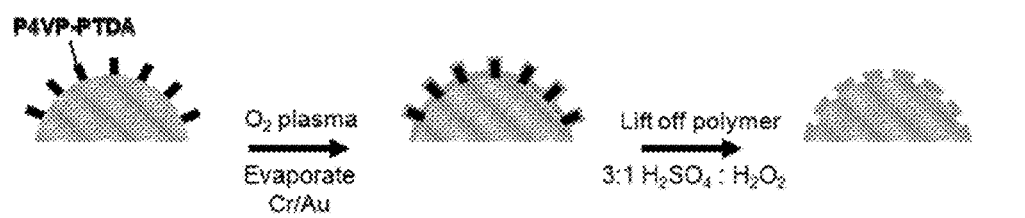
FIG. 7 depicts a graphical scheme showing a patterning process for depositing a metal surface.
Figure 8:
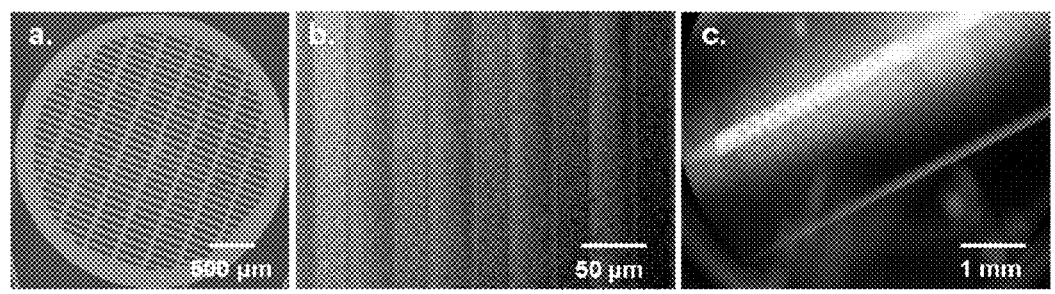
FIG. 8 depicts Cr/Au patterned on (a) planar silicon, (b) planar glass, and (c) a 3 mm-diameter glass rod.

The P4VP-PTDA resist can also be used to pattern metal features on planar and curved substrates. After a brief oxygen plasma treatment, Cr and Au are evaporated onto P4VP-PTDA-patterned substrate, and residual polymer is removed using a piranha solution (FIG. 7). Results for planar silicon, planar glass, and curved glass substrates are shown in FIG. 8. As in the above examples where polymer thin films were patterned on curved substrates, the metal structures are well-defined over the entire range of curvature.

Resist Properties

Figure 9:
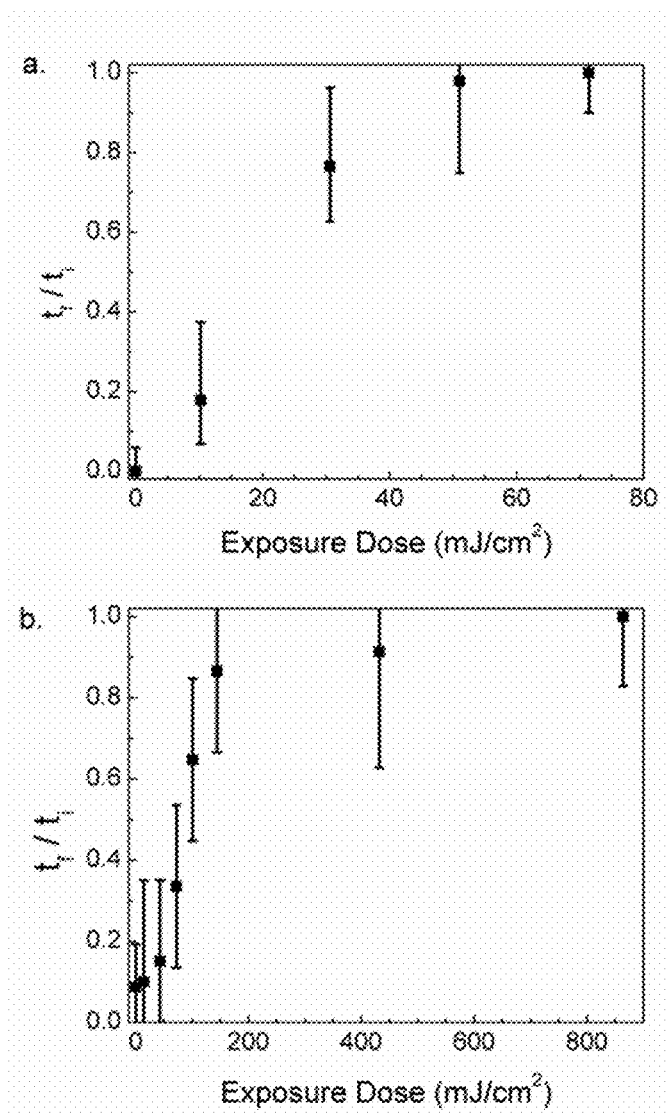
FIG. 9 depicts sensitivity plots for (a) iCVD P4VP-PTDA, and (b) iCVD P4VP. Note the different scales on the abscissae.

As mentioned previously, the demonstrated resolution of the P4VP-PTDA resist is approximately 3 µm to date. Considerations of energy consumption and processing time favor the use of high sensitivity resists, i.e., those requiring a low exposure dose. Sensitivities of negative photoresists can be quantified in terms of the minimum exposure dose, D*, at which $t_f/t_i=1.0$, where $t_i$ and $t_f$ are the thicknesses of the exposed film before and after developing. For TDA-functionalized P4VP ($t_i=100$ nm), we found D*=71±25 mJ cm$^{-2}$ (FIG. 9a). This value is comparable to recommended exposure doses for commercially available negative photoresists, including SU-8 and ma-N 2403 (on the order of 50 and 100 mJ cm$^{-2}$, respectively, at $t_i=100$ nm). The effect of the TDA functionalization step on sensitivity is revealed by performing similar measurements using non-functionalized iCVD P4VP (FIG. 9b). For the non-functionalized film, D* is approximately 800 mJ cm$^{-2}$; evidently, TDA functionalization improves sensitivity by an order of magnitude.

INCORPORATION BY REFERENCE

All of the U.S. patents and U.S. patent application publications cited herein are hereby incorporated by reference.

EQUIVALENTS

Those skilled in the art will recognize, or be able to ascertain using no more than routine experimentation, many equivalents to the specific embodiments of the invention described herein. Such equivalents are intended to be encompassed by the following claims.

We claim:

1. A method of making a composition, comprising the steps of:
   coating a surface of a substrate with a first polymer by initiated chemical vapor deposition in a deposition chamber, thereby forming a coated surface of the substrate;
   contacting the coated surface of the substrate with a photopolymerizable monomer, thereby forming a photopolymerizable surface of the substrate;
   masking with a mask a portion of the photopolymerizable surface of the substrate, thereby forming an exposed portion of the photopolymerizable surface of the substrate and a masked portion of the photopolymerizable surface of the substrate;
   exposing the exposed portion of the photopolymerizable surface of the substrate to radiation at a wavelength for a first period of time, thereby forming a coating material on the exposed portion of the surface of the substrate;
   removing the mask, thereby exposing the masked portion of the photopolymerizable surface of the substrate; and
   removing the masked portion of the photopolymerizable surface of the substrate, thereby forming the composition,
   wherein
   the composition comprises the substrate and the coating material;
   the coating material coats a portion of the surface of the substrate, thereby forming a feature comprising the coating material on the surface of the substrate;
   the first polymer comprises poly(4-vinylpyridine), poly(divinylbenzene), poly(maleic anhydride), poly(styrene), poly(tert-butyl acrylate), poly(trivinyltrimethoxycyclotrisiloxane), poly(furfuryl methacrylate), poly(glycidyl methacrylate), poly(4-aminostyrene), poly(hydroxyethyl methacrylate), poly(N-isopropylacracrylamide), poly(1H, 1H,2H,2H-perfluorodecyl acrylate), or copolymers thereof; and
   the photopolymerizable monomer comprises 10,12-tricosadiynoic acid, 3,5-octadiyn-1-ol, 3,5-octadiyne-1,8-diol, 7,9-hexadecadiyne, 3,5-octadiyne-2,7-diol, 3,5-nonadiyn-2-one, 4,6-decadiyne-3,8-diol, 8-chloro-2- methyl-1-octene-3,5-diyne, 5,7-dodecadiyne-1,12-diol, 1,10-dichloro-4,6-decadiyne, 4,6-dodecadiynal, 9,11-hexadecadiyn-1-ol, 2,7-dimethyl-3,5-octadiyne-2,7-diol, 5,7-eicosadiyn-1-ol, 2,7-dimethyl-3,5-nonadiyne-2,7-diol, 3,5-docosadiyn-1-ol, 1-bromo-4,6-nonadecadiyne, 1,3-octadiyn-1-yl-benzene, 3,8-dimethyl-4,6-decadiyne-3,8-diol, N,N-diethyl-3,5-octadiyn-1-amine, 4,6-dodecadiynoic acid, 1,1'-(1,3-butadiyne-1,4-diyl)bis-cyclopropane, 10,12-pentacosadiyn-1-ol, 4,6-decadiynedioic acid, 1,3-decadiyn-1-yl-benzene, 3,3'-(1,3-butadiyne-1,4-diyl)bis-cyclopropene, 5,7-tetradecadiynoic acid, 1-bromo-10,12-pentacosadiyne, (9Z)-1,9-heptadecadiene-4,6-diyn-3-ol, 10,12-heptadecadiynoic acid, 4,6-heptadecadiynoic acid, 5,7-hexadecadiynoic acid, 3,5-octadecadiynoic acid, 10,12-octadecadiynoic acid, 5,7-dodecadiynedoioic acid, 5,7-octadecadiynoic acid, 6,8-nonadecadiynoic acid, 10,12,18-nonadecatriynoic acid, 10,12,17-nonadecatriynoic acid, 10,12-heneicosadiynoic acid, 5,7-eicosadiynoic acid, 8,10-heneicosadiynoic acid, 5,7-docosadiynoic acid, 5,7-tetracosadiynoic acid, 2,3,8,9-tetramethyl-1,9-decadiene-4,6-diyne-3,8-diol, 10,12-pentacosadiynoic acid, 12,14-pentacosadiynoic acid, 10,12-heptacosadiynoic acid, 10,12-hexacosadiynoic acid, 12,14-heptacosadiynoic acid, $N^1,N^1,N^1,N^{10},N^{10},N^{10}$-hexamethyl-4,6-decadiyne-1,10-diaminium iodide, 10,12,18,20-tritriacontatetraynoic acid, 10,12-docosadiynedioic acid, 4,6-decadiynedioic acid 1,10-dimethyl ester, 10,12-tricosadiynoic acid methyl ester, 10,12-pentacosadiynoic acid methyl ester, 10,12-hexcosadiynoyl chloride, 4-(1,3-octadiyn-1-yl)-benzoic acid, 13-phenyl-10,12-tridecadiynoic acid, 1,1'-(1,3-butadiyne-1,4-diyl)bis[4-ethynylbenzene], 4,5,10,11-tetramethyl-2,4,10,12-tetradecatetraene-6,8-diynedioic acid, 10,12-docsadiynedioic acid 1,22-dimethyl ester, 3-(1,3-decadiyn-1-yl)-benzoic acid, 8-(3-heptyl-2-oxiranyl)-1-octene-4,6-diyn-3-ol, 3-(1,3-eicosadiyn-1-yl)-benzoic acid, N-hydroxy-13-phenyl-10,12-tridecadiynamide, 6-(3-heptyloxiranyl)-1-oxiranyl-2,4-hexadiyn-1-one, 1-nitro-4-(10,12-octadecadiyn-1-yloxy)-benzene, or 4-[5-[(1,1-dimethylpropyl)dioxy]-5-methyl-1,3-hexadiyn-1-yl]-benzoic acid.

2. The method of claim 1, wherein the surface comprises a plurality of features.

3. The method of claim 2, wherein the size of one dimension of the features is about 0.5 µm to about 1 mm.

4. The method of claim 2, wherein the thickness of the features is about 5 nm to about 1500 nm.

5. The method of claim 2, wherein the distance between features is about 500 nm to about 10 mm.

6. The method of claim 1, wherein the substrate is planar or non-planar.

7. The method of claim 1, wherein the substrate is glass, plastic, silicon, woven or non-woven fabric, quartz, or paper.

8. The method of claim 1, wherein the mask comprises glass or metal.

9. A method of making a composition, comprising the steps of:
   coating a surface of a substrate with a base polymer, thereby forming a base polymer-coated surface of the substrate;
   coating the base polymer-coated surface of the substrate with a first polymer by initiated chemical vapor deposition in a deposition chamber, thereby forming a first polymer-coated surface of the substrate;
   contacting the first polymer-coated surface of the substrate with a photopolymerizable monomer, thereby forming a photopolymerizable surface of the substrate;
   masking with a mask a portion of the photopolymerizable surface of the substrate, thereby forming an exposed portion of the photopolymerizable surface of the substrate and a masked portion of the photopolymerizable surface of the substrate;
   exposing the exposed portion of the photopolymerizable surface of the substrate to radiation at a wavelength for a first period of time, thereby forming a coating material on the exposed portion of the surface of the substrate;
   removing the mask, thereby exposing the masked portion of the photopolymerizable surface of the substrate; and
   removing the masked portion of the photopolymerizable surface of the substrate, thereby forming the composition,
wherein
the composition comprises the substrate, the base polymer, and the coating material;
the base polymer coats the surface of the substrate;
the coating material coats a portion of the base polymer-coated surface of the substrate, thereby forming a feature comprising the coating material on the base polymer-coated surface of the substrate;
the first polymer comprises poly(4-vinylpyridine), poly(divinylbenzene), poly(maleic anhydride), poly(styrene), poly(tert-butyl acrylate), poly(trivinyltrimethoxycyclotrisiloxane), poly(furfuryl methacrylate), poly(glycidyl methacrylate), poly(4-aminostyrene), poly(hydroxyethyl methacrylate), poly(N-isopropylacrlcrylamide), poly(1H, 1H,2H,2H-perfluorodecyl acrylate), Poly(methyl methacrylate), Poly(dimethylaminomethyl styrene), Poly(perfluoroalkyl ethyl methacrylate), Poly(ethylene glycol diacrylate), Poly(diethylene glycol divinyl ether), Poly(pentafluorophenyl methacrylate), Poly(methacrylic acid), Poly(propargyl methacrylate), Poly(1-vinyl-2-pyrrolidone), Poly(cyclohexyl methacrylate), Poly(tetravinyltetramethylcyclotetrasiloxane), Poly(1,3,5-trivinyl-1,1,3,5,5-pentamethyltrisiloxane), Poly(1,3-divinyl-1,1,3,3-tetramethyldisilazane), Poly(1,5-hexadiene-3,4-diol), Poly(ethyl acrylate), Poly(n-propyl acrylate), Poly(n-butyl acrylate), Poly(n-pentyl acrylate), Poly(n-hexyl acrylate), Poly(neopentyl acrylate), Poly(benzyl acrylate), Poly(isobornyl acrylate), Poly(2-(trimethylsilyloxy)ethyl acrylate), Poly(1,3-propanediol dimethacrylate), Poly(1,3-propanediol diacrylate), Poly(1H, 1H,2H,2H-perfluoroocto acrylate), Poly(1H,1H,2H,2H-perfluorohexa acrylate), Poly(2-isocyanatoethyl methacrylate), Poly(n-vinylcaprolactam), Poly(N,N-1-diethylacrylamide), Poly(9-vinylcarbazole), Poly(9-vinylanthracene), Poly(methyl vinyl ether), Poly(1-amino-2-propanol), Poly((2-ethylamino)ethanol), Poly(glycerol dimethacrylate), Poly(tri(ethylene glycol)divinyl ether), Poly(alpha methyl styrene), Poly(meta methyl styrene), Poly(para methyl styrene), Poly(vinylimidazole), Poly(1,4-divinyloxybutane), Poly(N-morpholinoethyl acrylate), Poly(2-morpholinoethyl methacrylate), Poly(tetrahydrofurfuryl methacrylate), Poly(2-isocyanatoethyl methacrylate), Poly(2-sulfoethyl methacrylate), Poly(2-methoxyethyl methacrylate), Poly(2-(tert-butylamino)ethyl methacrylate), Poly(2-ethoxyethyl methacrylate), Poly(2-chloroethyl methacrylate), Poly(2-Hydroxypropyl methacrylate), Poly(2-diethylaminoethyl methacrylate), Poly(cyclopentyl methacrylate), Poly(2-(diisopropylamino)

ethyl methacrylate), Poly(2-bromoethyl methacrylate), Poly(2-phenylethyl methacrylate), or copolymers thereof; and the photopolymerizable monomer comprises 10,12-tricosadiynoic acid, 3,5-octadiyn-1-ol, 3,5-octadiyne-1,8-diol, 7,9-hexadecadiyne, 3,5-octadiyne-2,7-diol, 3,5-nonadiyn-2-one, 4,6-decadiyne-3,8-diol, 8-chloro-2-methyl-1-octene-3,5-diyne, 5,7-dodecadiyne-1,12-diol, 1,10-dichloro-4,6-decadiyne, 4,6-dodecadiynal, 9,11-hexadecadiyn-1-ol, 2,7-dimethyl-3,5-octadiyne-2,7-diol, 5,7-eicosadiyn-1-ol, 2,7-dimethyl-3,5-nonadiyne-2,7-diol, 3,5-docosadiyn-1-ol, 1-bromo-4,6-nonadecadiyne, 1,3-octadiyn-1-yl-benzene, 3,8-dimethyl-4,6-decadiyne-3,8-diol, N,N-diethyl-3,5-octadiyn-1-amine, 4,6-dodecadiynoic acid, 1,1'-(1,3-butadiyne-1,4-diyl)bis-cyclopropane, 10,12-pentacosadiyn-1-ol, 4,6-decadiynedioic acid, 1,3-decadiyn-1-yl-benzene, 3,3'-(1,3-butadiyne-1,4-diyl)bis-cyclopropene, 5,7-tetradecadiynoic acid, 1-bromo-10,12-pentacosadiyne, (9Z)-1,9-heptadecadiene-4,6-diyn-3-ol, 10,12-heptadecadiynoic acid, 4,6-heptadecadiynoic acid, 5,7-hexadecadiynoic acid, 3,5-octadecadiynoic acid, 10,12-octadecadiynoic acid, 5,7-dodecadiynedioioic acid, 5,7-octadecadiynoic acid, 6,8-nonadecadiynoic acid, 10,12,18-nonadecatriynoic acid, 10,12,17-nonadecatriynoic acid, 10,12-heneicosadiynoic acid, 5,7-eicosadiynoic acid, 8,10-heneicosadiynoic acid, 5,7-docosadiynoic acid, 5,7-tetracosadiynoic acid, 2,3,8,9-tetramethyl-1,9-decadiene-4,6-diyne-3,8-diol, 10,12-pentacosadiynoic acid, 12,14-pentacosadiynoic acid, 10,12-heptacosadiynoic acid, 10,12-hexacosadiynoic acid, 12,14-heptacosadiynoic acid, $N^1,N^1,N^1,N^{10},N^{10},N^{10}$-hexamethyl-4,6-decadiyne-1,10-diaminium iodide, 10,12,18,20-tritriacontatetraynoic acid, 10,12-docosadiynedioic acid, 4,6-decadiynedioic acid 1,10-dimethyl ester, 10,12-tricosadiynoic acid methyl ester, 10,12-pentacosadiynoic acid methyl ester, 10,12-hexcosadiynoyl chloride, 4-(1,3-octadiyn-1-yl)-benzoic acid, 13-phenyl-10,12-tridecadiynoic acid, 1,1'-(1,3-butadiyne-1,4-diyl)bis[4-ethynylbenzene], 4,5,10,11-tetramethyl-2,4,10,12-tetradecatetraene-6,8-diynedioic acid, 10,12-docsadiynedioic acid 1,22-dimethyl ester, 3-(1,3-decadiyn-1-yl)-benzoic acid, 8-(3-heptyl-2-oxiranyl)-1-octene-4,6-diyn-3-ol, 3-(1,3-eicosadiyn-1-yl)-benzoic acid, N-hydroxy-13-phenyl-10,12-tridecadiynamide, 6-(3-heptyloxiranyl)-1-oxiranyl-2,4-hexadiyn-1-one, 1-nitro-4-(10,12-octadecadiyn-1-yloxy)-benzene, or 4-[5-[(1,1-dimethylpropyl)dioxy]-5-methyl-1,3-hexadiyn-1-yl]-benzoic acid.

10. The method of claim 9, wherein the surface comprises a plurality of features.

11. The method of claim 10, wherein the size of one dimension of the features is about 0.5 μm to about 1 mm.

12. The method of claim 10, wherein the thickness of the features is about 5 nm to about 1500 nm.

13. The method of claim 10, wherein the distance between features is about 500 nm to about 10 mm.

14. The method of claim 9, wherein the substrate is planar or non-planar.

15. The method of claim 9, wherein the substrate is glass, plastic, silicon, woven or non-woven fabric, quartz, or paper.

16. The method of claim 9, wherein the mask comprises glass or metal.

* * * * *